(12) United States Patent
Fuji et al.

(10) Patent No.: US 11,446,762 B2
(45) Date of Patent: Sep. 20, 2022

(54) LASER IRRADIATION APPARATUS, LASER IRRADIATION METHOD, AND METHOD OF MANUFACTURING SEMICONDUCTOR DEVICE

(71) Applicant: JSW AKTINA SYSTEM CO., LTD., Yokohama (JP)

(72) Inventors: Takahiro Fuji, Yokohama (JP); Yuki Suzuki, Yokohama (JP); Takahiro Mikami, Yokohama (JP); Yoshihiro Yamaguchi, Yokohama (JP)

(73) Assignee: JSW AKTINA SYSTEM CO., LTD., Kanagawa (JP)

( * ) Notice: Subject to any disclaimer, the term of this patent is extended or adjusted under 35 U.S.C. 154(b) by 899 days.

(21) Appl. No.: 16/323,323

(22) PCT Filed: Jun. 2, 2017

(86) PCT No.: PCT/JP2017/020640
§ 371 (c)(1),
(2) Date: Feb. 5, 2019

(87) PCT Pub. No.: WO2018/042796
PCT Pub. Date: Mar. 8, 2018

(65) Prior Publication Data
US 2019/0193200 A1    Jun. 27, 2019

(30) Foreign Application Priority Data
Aug. 29, 2016    (JP) .............................. JP2016-166465

(51) Int. Cl.
*B23K 26/10*    (2006.01)
*H01L 21/20*    (2006.01)
(Continued)

(52) U.S. Cl.
CPC .......... *B23K 26/10* (2013.01); *B23K 26/0738* (2013.01); *B23K 26/0838* (2013.01);
(Continued)

(58) Field of Classification Search
CPC ............ B23K 2101/18; B23K 2101/40; B23K 2103/172; B23K 2103/50; B23K 26/0738;
(Continued)

(56) References Cited

U.S. PATENT DOCUMENTS

2004/0106242 A1    6/2004    Arao et al.
2007/0017442 A1*   1/2007    Yamasaki ......... H01L 21/67784
                                                                 118/695
(Continued)

FOREIGN PATENT DOCUMENTS

JP    2002-231654 A    8/2002
JP    2002231654    *    8/2002
(Continued)

OTHER PUBLICATIONS

International Search Report from International Patent Application No. PCT/JP2017/020640, dated Aug. 22, 2017.

*Primary Examiner* — Dana Ross
*Assistant Examiner* — Joseph W Iskra
(74) *Attorney, Agent, or Firm* — SGPatents PLLC

(57) ABSTRACT

A laser irradiation apparatus (1) according to one embodiment irradiates a workpiece (16) with a laser beam (15) while conveying the workpiece (16) caused to float with the use of a flotation unit (10). The flotation unit (10) includes precision float regions (11a, 11b) and rough float regions (13a to 13j). The precision float regions (11a, 11b) are configured to cause the workpiece (16) to float by utilizing ejection and suction of a gas, and the rough float regions are configured to cause the workpiece (16) to float by utilizing ejection of a gas without suction of a gas.

20 Claims, 26 Drawing Sheets

(51) Int. Cl.
  *H01L 21/268* (2006.01)
  *B23K 26/073* (2006.01)
  *B23K 26/08* (2014.01)
  *B23K 37/04* (2006.01)
  *B23K 26/70* (2014.01)
  *H01L 21/677* (2006.01)
  *H01L 21/67* (2006.01)
  *H01L 21/683* (2006.01)
  *B65G 51/03* (2006.01)
  *B23K 103/00* (2006.01)
  *B23K 101/18* (2006.01)
  *B23K 101/40* (2006.01)
  *B23K 103/16* (2006.01)

(52) U.S. Cl.
  CPC ........ *B23K 26/702* (2015.10); *B23K 37/0408* (2013.01); *H01L 21/20* (2013.01); *H01L 21/268* (2013.01); *H01L 21/6776* (2013.01); *H01L 21/67115* (2013.01); *H01L 21/67784* (2013.01); *H01L 21/683* (2013.01); *B23K 2101/18* (2018.08); *B23K 2101/40* (2018.08); *B23K 2103/172* (2018.08); *B23K 2103/50* (2018.08); *B65G 51/03* (2013.01)

(58) Field of Classification Search
  CPC .. B23K 26/0838; B23K 26/10; B23K 26/702; B23K 37/0408; B65G 51/03; H01L 21/20; H01L 21/268; H01L 21/67115; H01L 21/6776; H01L 21/67784; H01L 21/683
  USPC ...................................................... 219/121.6
  See application file for complete search history.

(56) References Cited

U.S. PATENT DOCUMENTS

2007/0241086 A1  10/2007  Arao et al.
2009/0181552 A1  7/2009  Shimomura et al.

FOREIGN PATENT DOCUMENTS

| JP | 2002-280321 A | | 9/2002 |
| JP | 2004-179653 A | | 6/2004 |
| JP | 2004179653 | * | 6/2004 |
| JP | 2007-027495 A | | 2/2007 |
| JP | 2009-194370 A | | 8/2009 |
| JP | 2010-225602 A | | 10/2010 |

* cited by examiner

LASER IRRADIATION APPARATUS, LASER IRRADIATION METHOD, AND METHOD OF MANUFACTURING SEMICONDUCTOR DEVICE

TECHNICAL FIELD

The present invention relates to laser irradiation apparatuses, laser irradiation methods, and methods of manufacturing semiconductor devices. For example, the present invention relates to a laser irradiation apparatus provided with a flotation unit that conveys a workpiece while causing the workpiece to float, a laser irradiation method, and a method of manufacturing a semiconductor device.

BACKGROUND ART

A laser annealing apparatus that irradiates an amorphous film formed on a silicon substrate, a glass substrate, or the like with a laser beam to crystallize the amorphous film is known. Patent Literature 1 discloses a laser annealing apparatus that irradiates a substrate with a laser beam while conveying the substrate caused to float with the use of a gas floating device.

CITATION LIST

Patent Literature

Patent Literature 1: Japanese Unexamined Patent Application Publication No. 2002-280321

SUMMARY OF INVENTION

Technical Problem

In a laser annealing apparatus that conveys a workpiece with the workpiece caused to float by blowing a gas against the substrate, as in the laser annealing apparatus disclosed in Patent Literature 1, if the gas blown against the workpiece becomes uneven, the deflection amount of the workpiece increases during conveyance, which leads to a problem in that the workpiece goes out of the depth of focus (DOF) of the laser beam.

Other issues and novel features will become apparent from the descriptions in the present specification and the appended drawings.

Solution to Problem

A laser irradiation apparatus according to one embodiment includes a flotation unit provided with a first region and a second region. The first region is configured to cause a workpiece to float by utilizing ejection and suction of a gas, and the second region is configured to cause the workpiece to float by utilizing ejection of a gas without suction of a gas.

In a laser irradiation method according to one embodiment, when a workpiece is conveyed with the use of a flotation unit that is provided with a first region and a second region, the first region conveys the workpiece while causing the workpiece to float by utilizing ejection and suction of a gas, and the second region conveys the workpiece while causing the workpiece to float by utilizing ejection of a gas without suction of a gas.

A method of manufacturing a semiconductor device according to one embodiment includes (a) a step of forming an amorphous film on a substrate; and (b) a step of irradiating the amorphous film with a laser beam to crystallize the amorphous film. In the step of (b), when a workpiece is conveyed with the use of a flotation unit that is provided with a first region and a second region, the first region conveys the workpiece while causing the workpiece to float by utilizing ejection and suction of a gas, and the second region conveys the workpiece while causing the workpiece to float by utilizing ejection of a gas without suction of a gas.

Advantageous Effects of Invention

The embodiments described above can provide a laser irradiation apparatus, a laser irradiation method, and a method of manufacturing a semiconductor device that can reduce deflection of a workpiece during conveyance.

DESCRIPTION OF EMBODIMENTS

First Embodiment

Figure 1:
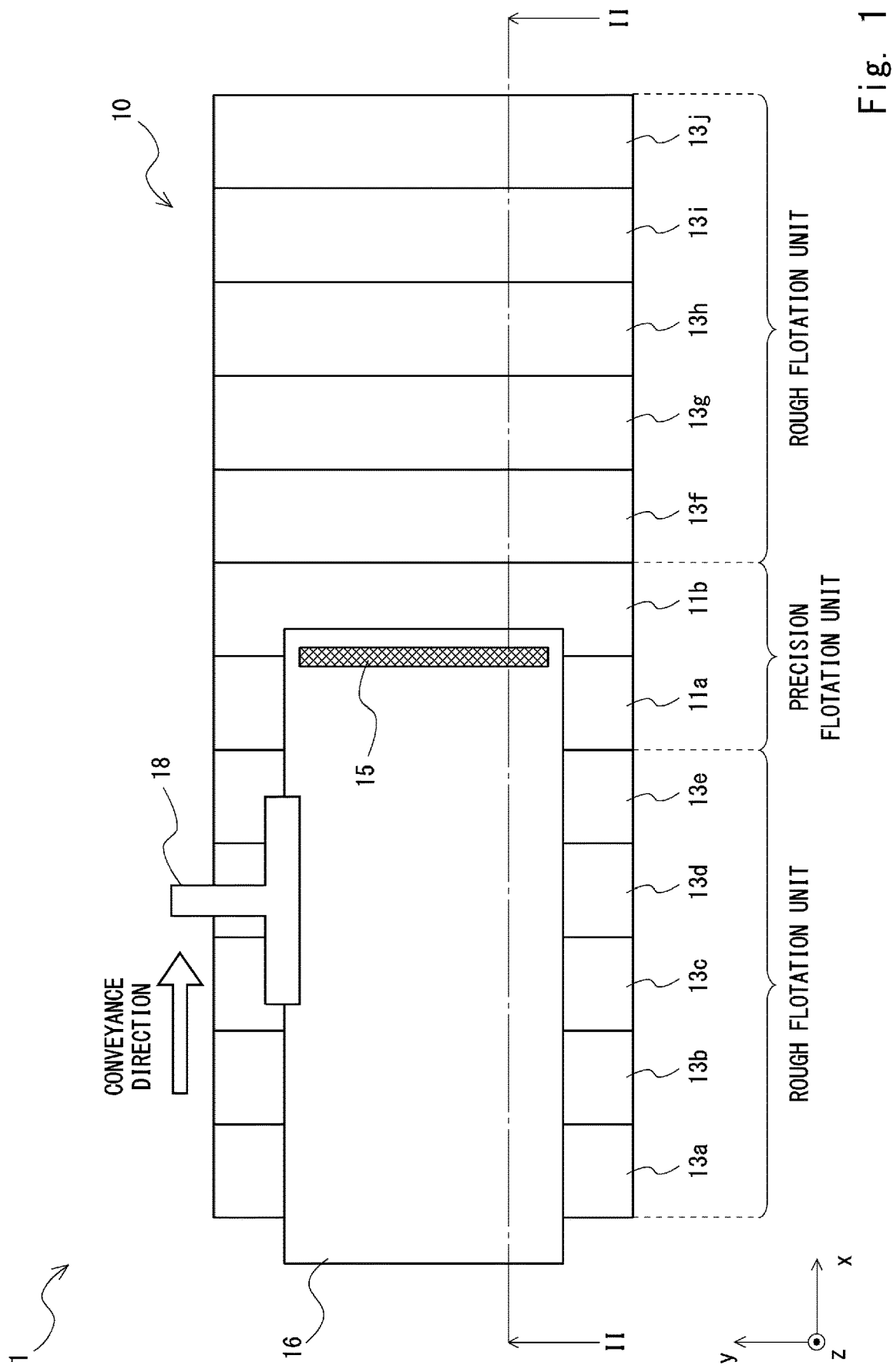
FIG. 1 is a plan view for describing a laser irradiation apparatus according to a first embodiment.
Figure 2:
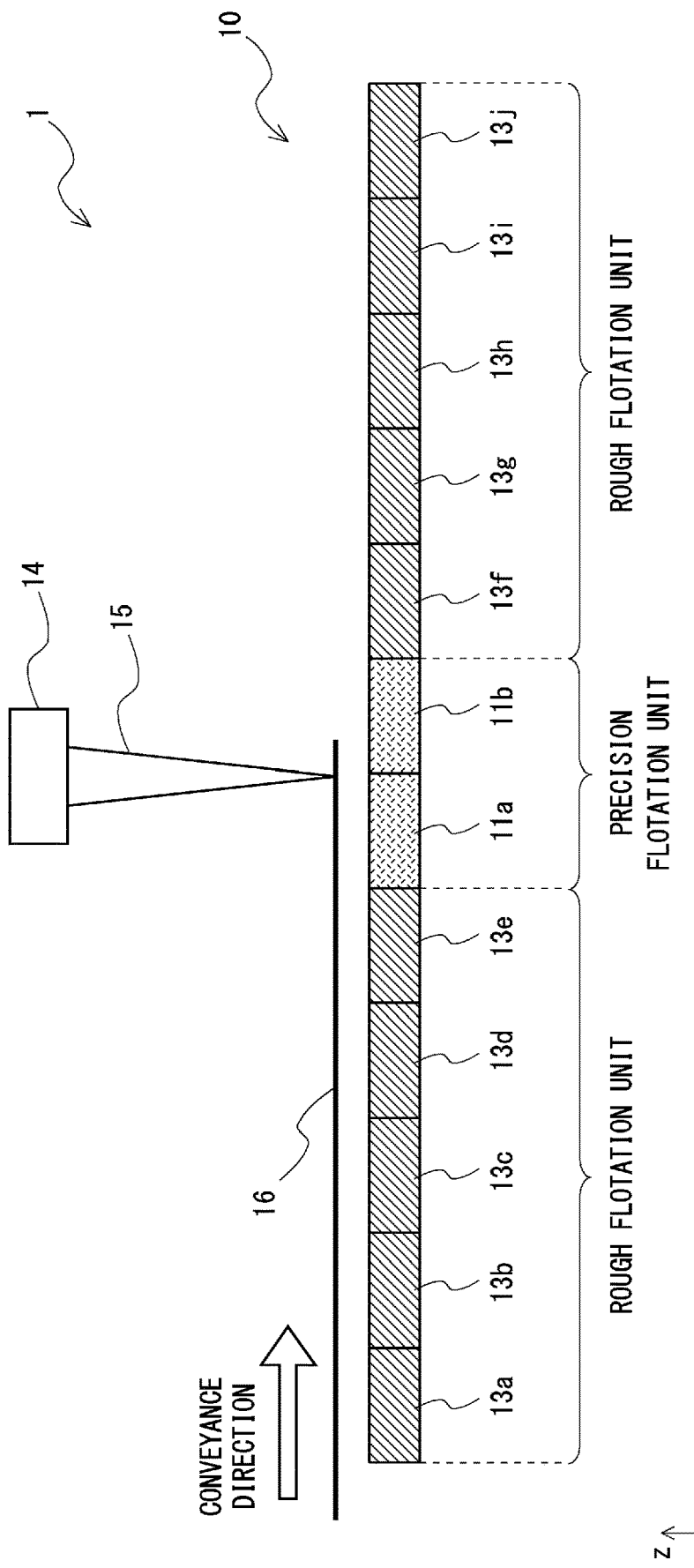
FIG. 2 is a sectional view of the laser irradiation apparatus illustrated in FIG. 1, taken along the cutting-plane line II-II.

Hereinafter, a laser irradiation apparatus according to a first embodiment will be described with reference to the drawings. FIG. 1 is a plan view for describing the laser irradiation apparatus according to the first embodiment. FIG. 2 is a sectional view of the laser irradiation apparatus illustrated in FIG. 1, taken along the cutting-plane line II-II. (Configuration of Laser Irradiation Apparatus)

As illustrated in FIGS. 1 and 2, a laser irradiation apparatus 1 includes a flotation unit 10. The flotation unit 10 conveys the workpiece 16 while causing the workpiece 16 to float. Specifically, the laser irradiation apparatus 1 conveys the workpiece 16 in a conveyance direction (x-axis direction) with the workpiece 16 being held by a holder 18 (see FIG. 1) while causing the workpiece 16 to float with the use of the flotation unit 10. While the workpiece 16 is being conveyed, the flotation unit 10 adjusts the floating amount so that the workpiece 16 does not come into contact with another mechanism (not illustrated) disposed over the workpiece 16.

A vacuum suction mechanism of a suction cup type or a vacuum suction mechanism provided with a porous member can, for example, be used for the holder 18. The holder 18 is coupled to a discharging port (not illustrated), and the discharging port is coupled to an ejector, a vacuum pump, or the like. Thus, a negative pressure for sucking in a gas acts on an intake port. This configuration causes the vacuum suction mechanism of the holder 18 to be sucked onto the workpiece 16. The holder 18 is conveyed by a driving mechanism of the holder 18 while holding the workpiece 16. Thus, the workpiece 16 is conveyed. The conveyance speed of the workpiece 16 can be controlled by adjusting the conveyance speed of the driving mechanism of the holder 18. For example, the workpiece 16 is conveyed at a uniform speed while floating over the flotation unit 10. Thus, the workpiece 16 passes through an irradiation position of a laser beam at a constant speed.

The workpiece 16 is irradiated with a laser beam 15 (hereinafter, the irradiation position of the laser beam is also denoted by the reference numeral 15). For example, the laser irradiation apparatus is a laser annealing apparatus. In this case, an excimer laser or the like can be used as a laser generating device 14. A laser beam supplied from the laser generating device 14 is given a line shape by an optical system (not illustrated), and the workpiece 16 is irradiated with the line-shaped laser beam 15 (line beam) that, specifically, has a focal point extending in the y-axis direction. The workpiece is, for example, an amorphous film formed on a substrate. This amorphous film is irradiated with the laser beam 15 to be annealed, and thus the amorphous film can be crystallized.

As illustrated in FIGS. 1 and 2, the flotation unit 10 is constituted by precision flotation units 11a and 11b and rough flotation units 13a to 13j. In the following, regions composed of the precision flotation units 11a and 11b are also referred to as precision float regions 11a and 11b, respectively; and regions composed of the rough flotation units 13a to 13j are also referred to as rough float regions 13a to 13j, respectively.

The precision flotation units 11a and 11b are disposed in a region (precision float region) that includes the irradiation position 15 of the laser beam. The rough flotation units 13a to 13e are disposed upstream from the precision flotation units 11a and 11b in the conveyance direction of the workpiece 16 (i.e., on the negative side in the x-axis direction). The rough flotation units 13f to 13j are disposed downstream from the precision flotation units 11a and 11b in the conveyance direction of the workpiece 16 (i.e., on the positive side in the x-axis direction). As illustrated in FIGS. 1 and 2, the precision flotation units 11a and 11b and the rough flotation units 13a to 13j are each, for example, a rectangular unit that extends in the y-axis direction, and these flotation units are arrayed in the conveyance direction (x-axis direction). The workpiece 16 is conveyed so as to pass over the rough flotation units 13a to 13e, the precision flotation units 11a and 11b, and the rough flotation units 13f to 13j in this order. The shape of each flotation unit is not limited to a rectangular shape. For example, the shape of each flotation unit may be square.

To rephrase, the precision float regions 11a and 11b are disposed so that the focal point of the laser beam 15 (corresponding to the irradiation position 15 of the laser beam, the same applies hereinafter) is superposed on the precision float regions 11a and 11b as viewed in a plan view. The rough flotation units 13a to 13j are disposed so that the focal point of the laser beam 15 is not superposed on the rough float regions 13a to 13j. Herein, "as viewed in a plan view" means a case in which the flotation unit 10 is viewed in the z-axis direction as illustrated in FIG. 1.

The precision flotation units 11a and 11b convey the workpiece 16 while causing the workpiece 16 to float with high precision. The precision flotation units 11a and 11b are configured to be capable of conveying the workpiece 16 while keeping the deflection amount of the workpiece 16 small during conveyance. The precision flotation units 11a and 11b, for example, control an ejection amount of a gas for causing the workpiece 16 to float with high precision. For example, the precision float regions (precision flotation units) 11a and 11b are configured to cause the workpiece 16 to float by utilizing ejection and suction of a gas. A detailed configuration of the precision flotation units 11a and 11b will be described in concrete terms with reference to FIGS. 7 to 9.

The rough flotation units 13a to 13j convey the workpiece 16 while causing the workpiece 16 to float. Since it suffices that the workpiece 16 refrain from making contact with the rough flotation units 13a to 13j during conveyance, the rough flotation units 13a to 13j do not control the ejection amount of a gas for causing the workpiece 16 to float with as high precision as that of the precision flotation units 11a and 11b. Therefore, the deflection amount of the workpiece 16 held when the workpiece 16 passes over the rough flotation units 13a to 13j is greater than the deflection amount of the workpiece 16 held when the workpiece 16 passes over the precision flotation units 11a and 11b. For example, the rough float regions (rough flotation units) 13a to 13j are configured to cause the workpiece 16 to float by utilizing ejection of a gas without suction of a gas. A detailed configuration of the rough flotation units 13a to 13j will be described in concrete terms with reference to FIGS. 10 to 12.

The precision flotation units 11a and 11b are configured to be capable of conveying the workpiece 16 while keeping the deflection amount of the workpiece 16 small during conveyance. Therefore, the precision flotation units 11a and 11b each have a more precise structure than the rough flotation units 13a to 13j configured to convey the workpiece 16 while simply ejecting a gas, and thus the precision flotation units 11a and 11b are more expensive. Accordingly, in the laser irradiation apparatus 10 according to the first embodiment, the precision flotation units 11a and 11b are disposed only in a region that includes the irradiation position 15 of the laser beam, and the rough flotation units 13a to 13j, which can be constituted less expensively than the precision flotation units, are disposed in the remaining region.

In the present embodiment, the flatness of the surfaces of the precision flotation units 11a and 11b that are to oppose the workpiece 16 is smaller than the flatness of the surfaces of the rough flotation units 13a to 13j that are to oppose the workpiece 16. In one example, the flatness of the precision flotation units 11a and 11b is no greater than 20 and the flatness of the rough flotation units 13a to 13j is no greater than 75 In the following, the precision flotation units 11a and 11b may also be referred to as a precision flotation unit 11, and the rough flotation units 13a to 13j may also be referred to as a rough flotation unit 13.

For example, the flatness of the precision flotation unit 11 can be defined by the floating amount (floating height) of the workpiece 16 floating over the precision flotation unit 11 and the deflection amount of the workpiece 16. Deflection of the workpiece 16 is conceivably affected by the floating amount of the workpiece 16 and the flatness of the surface of the flotation unit. The floating amount of the workpiece 16 is conceivably affected by a pressure caused by a gas present between the workpiece 16 and the flotation unit.

Figure 3:
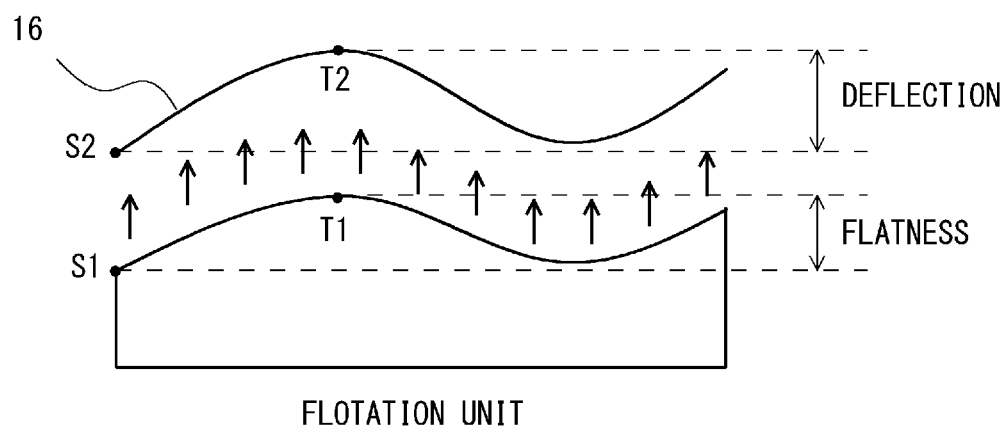
FIG. 3 is a sectional view for describing a relationship between the flatness of a flotation unit and deflection of a workpiece.

FIG. 3 is a sectional view for describing a relationship between the flatness of the flotation unit and deflection of the workpiece. As illustrated in FIG. 3, the flatness of the flotation unit can be defined by a distance between a reference point S1, which is the lowest portion on the flotation unit, and T1, which is the highest portion on the flotation unit. Deflection of the workpiece 16 can be defined by a distance between a reference point S2, which is the lowest portion of the workpiece 16, and T2, which is the highest portion of the workpiece 16.

In the rough flotation unit 13, the floating amount of the workpiece 16 is smallest at an edge portion thereof. Therefore, in order to keep the workpiece 16 from colliding with the rough flotation unit 13, the flatness of the surface of the rough flotation unit 13 needs to be set small to a certain extent. As illustrated in FIG. 3, the workpiece 16 floats so as not to collide with the flotation unit. However, the floating amount of the workpiece 16 is at a height from the surface of the flotation unit serving as a zero point, and thus the workpiece 16 and the rough flotation unit may collide with each other unless the flatness of the surface of the rough flotation unit is also set small. In other words, it is necessary to set the flatness of the surface of the rough flotation unit small to a certain extent, as illustrated in FIG. 3, to keep the highest portion T1 of the flotation unit from colliding with the lowest portion S2 of the workpiece 16.

In the precision flotation unit 11, the floating amount of the workpiece 16 is smaller than that in the rough flotation unit 13, and the floating amount of the workpiece 16 is smallest at an edge portion thereof. Therefore, a measure needs to be taken to keep the workpiece 16 from colliding with the flotation unit. For example, when deflection or the floating amount of the workpiece 16 changes steeply as in a portion near the boundary between the rough flotation unit 13e and the precision flotation unit 11a illustrated in FIG. 4B, an influence on the laser irradiation portion increases. When the flatness of the precision flotation unit 11 is not ensured at a sufficient level, the change in the deflection of the workpiece 16 may adversely affect the laser irradiation. For such a reason, the flatness of the precision flotation unit 11 needs to be set small.

Since the flatness of the precision flotation unit 11 needs to be smaller than the flatness of the rough flotation unit 13, it is preferable to set the area of the upper surface of each precision flotation unit smaller than the area of the upper surface of the rough flotation unit in order to maintain the flatness of the precision flotation unit 11. Meanwhile, the rough flotation unit 13 can have an upper surface with a greater area than that of the precision flotation unit 11 in order to convey the workpiece 16 while causing the workpiece 16 to float so as not to collide with the flotation unit.

In the foregoing, an example of the area of the upper surface of each flotation unit has been described. Alternatively, the upper surfaces of the precision flotation units 11a and 11b and of the rough flotation units 13a to 13j may have an identical area. In the present embodiment (see FIG. 1), the areas of the upper surfaces of the flotation units are identical in order to simplify the description.

Figure 4:
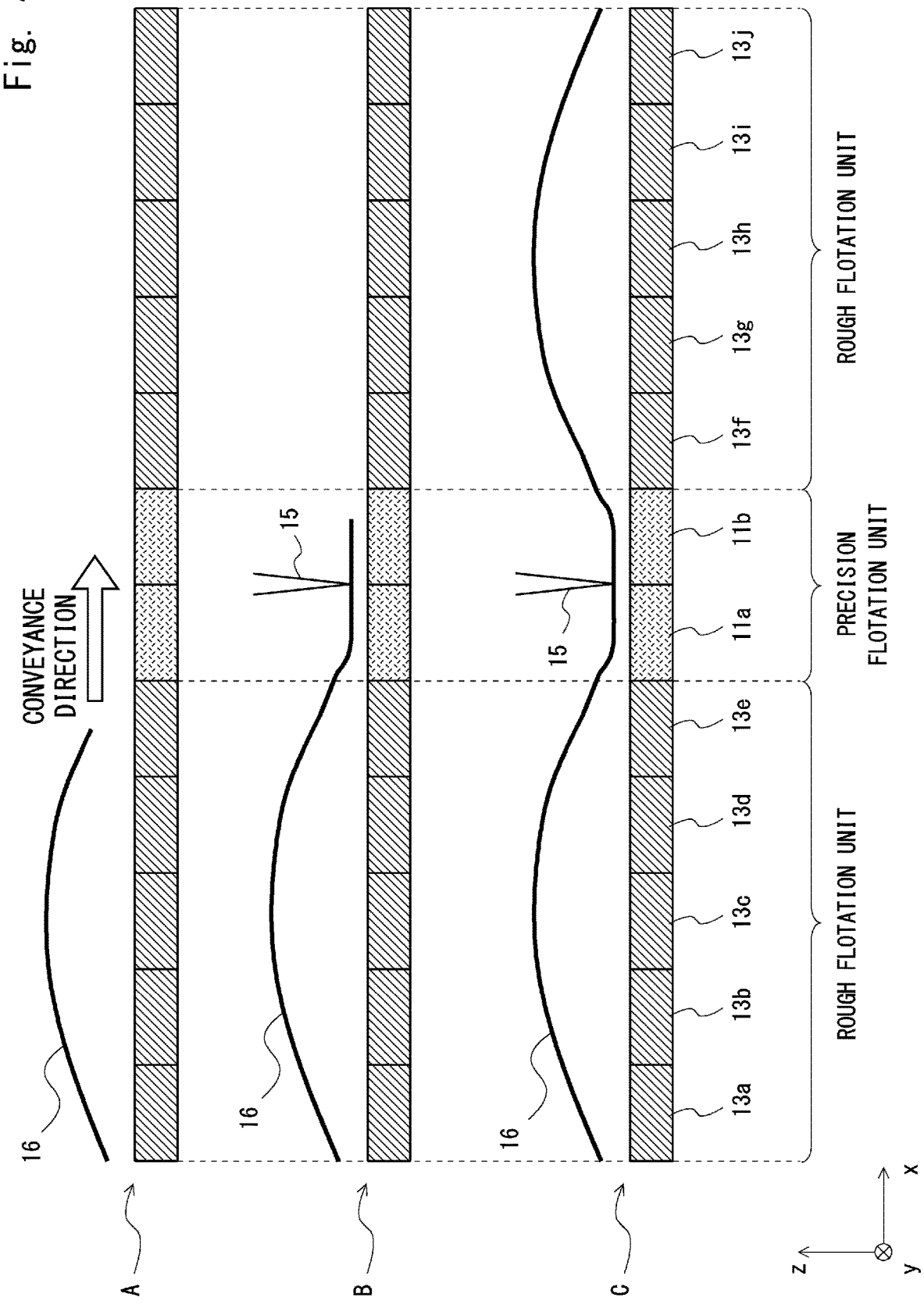
FIG. 4 is a sectional view for describing a state in which a workpiece is being conveyed with the use of the laser irradiation apparatus according to the first embodiment.

FIG. 4 is a sectional view for describing a state in which the workpiece 16 is being conveyed with the use of the laser irradiation apparatus 1. As illustrated in FIG. 4A, the deflection amount of the workpiece 16 is large while the workpiece 16 is passing over the rough flotation units 13a to 13e. This is because the ejection amount of a gas is not controlled with high precision while the workpiece 16 is being conveyed with the use of the rough flotation units 13a to 13e since it suffices that the workpiece 16 refrain from making contact with the rough flotation units 13a to 13e.

Thereafter, the workpiece 16 is conveyed, and while the workpiece 16 is passing over the precision flotation units 11a and 11b, as illustrated in FIG. 4B, the deflection amount of the workpiece 16 is smaller than the deflection amount thereof held while the workpiece 16 is passing over the rough flotation units 13a to 13e. Therefore, it is possible to irradiate the workpiece 16 having less deflection with the laser beam 15.

Thereafter, the workpiece 16 is conveyed, and while the workpiece 16 is passing over the rough flotation units 13f to 13j, as illustrated in FIG. 4C, the deflection amount of the workpiece 16 is large. This is because the ejection amount of a gas is not controlled with high precision while the workpiece 16 is being conveyed with the use of the rough flotation units 13f to 13j since it suffices that the workpiece 16 refrain from making contact with the rough flotation units 13f to 13j.

In this manner, in the laser irradiation apparatus 1 according to the first embodiment, the precision flotation units 11a and 11b are disposed in a region that includes the irradiation position 15 of the laser beam to reduce the deflection amount of the workpiece 16 therein. Accordingly, it is possible to keep the workpiece 16 from being out of the depth of focus (DOF) of the irradiating laser beam.

In addition, in the laser irradiation apparatus 1 according to the first embodiment, the precision flotation units 11a and 11b are disposed only in a region that includes the irradiation position 15 of the laser beam, and the rough flotation units 13a to 13j, which can be constituted less expensively than the precision flotation units, are disposed in the remaining region. Accordingly, the cost of the laser irradiation apparatus 1 can be reduced. In addition, since the region that requires precise control can be limited to the region where the precision flotation units 11a and 11b are disposed, the control of the laser irradiation apparatus 1 can be simplified.

Second Embodiment

Figure 5:
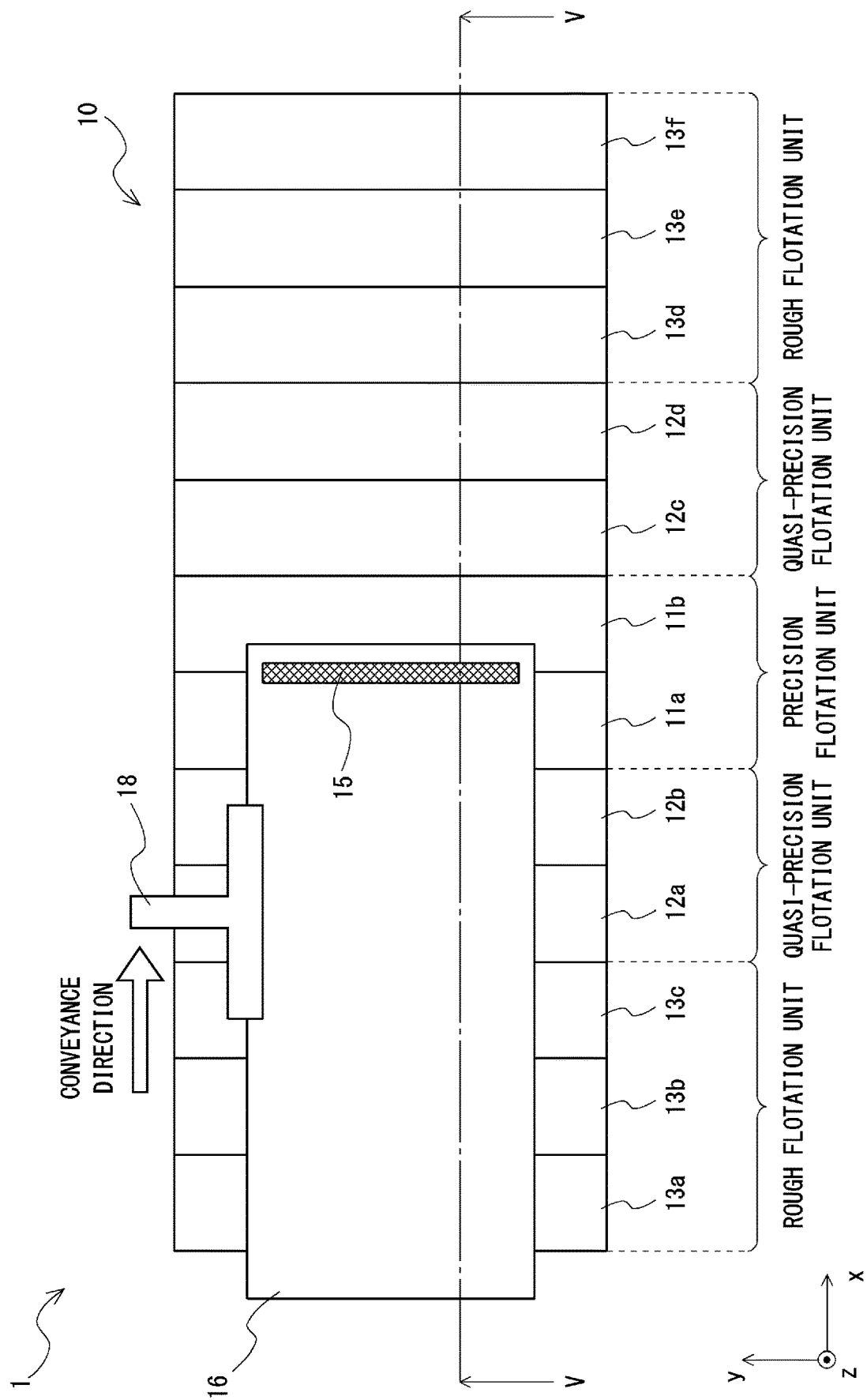
FIG. 5 is a plan view for describing a laser irradiation apparatus according to a second embodiment.
Figure 6:
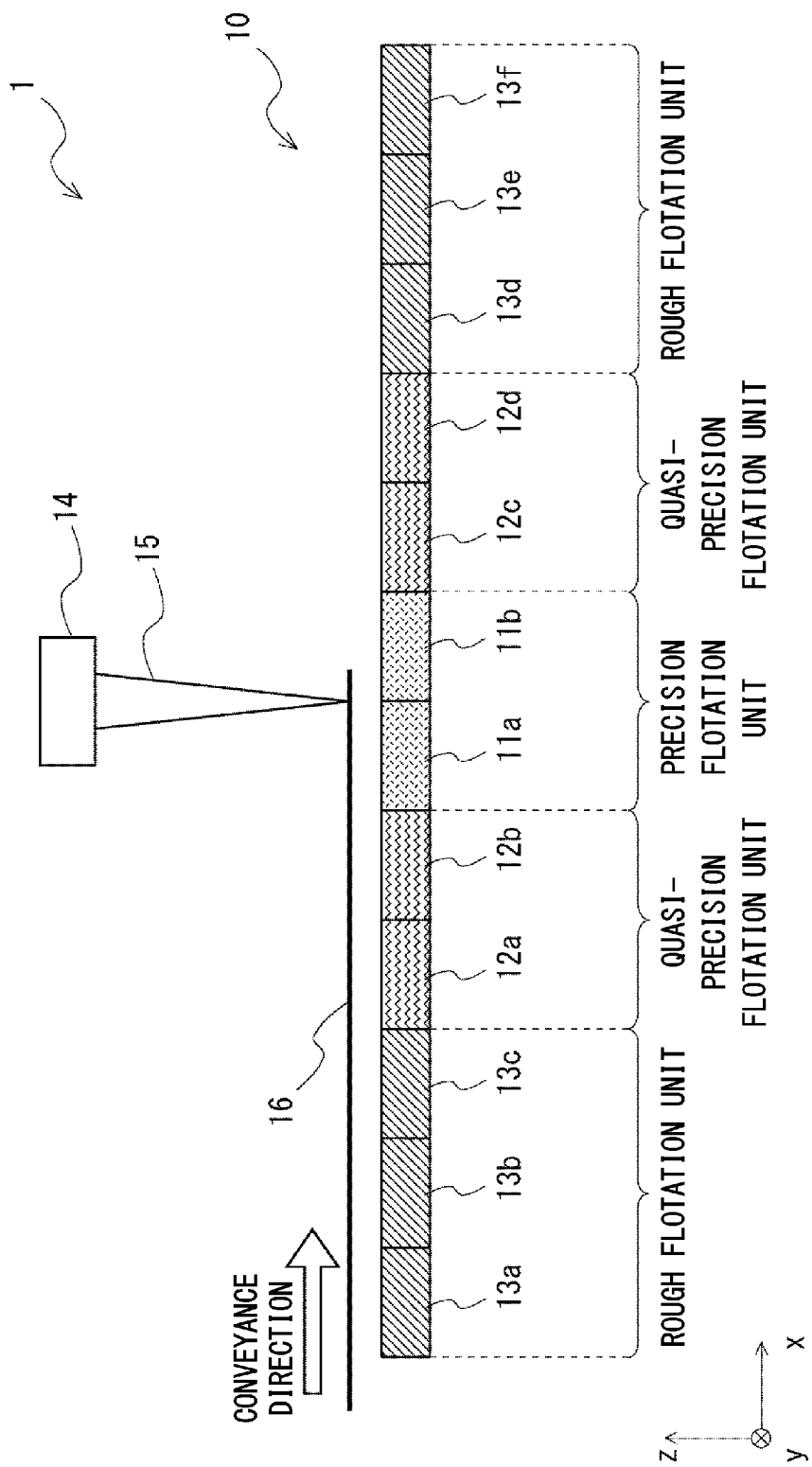
FIG. 6 is a sectional view of the laser irradiation apparatus illustrated in FIG. 5, taken along the cutting-plane line V-V.

Next, a laser irradiation apparatus according to a second embodiment will be described. FIG. 5 is a plan view for describing the laser irradiation apparatus according to the second embodiment. FIG. 6 is a sectional view of the laser irradiation apparatus illustrated in FIG. 5, taken along the cutting-plane line V-V. A laser irradiation apparatus 1 irradiates a workpiece 16 with a laser beam 15 while conveying the workpiece 16 caused to float with the use of a flotation unit 10.

(Configuration of Laser Irradiation Apparatus)

As illustrated in FIGS. 5 and 6, the laser irradiation apparatus 1 includes the flotation unit 10. The flotation unit 10 conveys the workpiece 16 while causing the workpiece 16 to float. Specifically, the laser irradiation apparatus 1 conveys the workpiece 16 in a conveyance direction (x-axis direction) with the workpiece 16 being held by a holder 18 (see FIG. 5) while causing the workpiece 16 to float with the use of the flotation unit 10. While the workpiece 16 is being conveyed, the flotation unit 10 adjusts the floating amount so that the workpiece 16 does not come into contact with another mechanism (not illustrated) disposed over the workpiece 16.

A vacuum suction mechanism of a suction cup type or a vacuum suction mechanism provided with a porous member can, for example, be used for the holder 18. The holder 18 is coupled to a discharging port (not illustrated), and the discharging port is coupled to an ejector, a vacuum pump, or the like. Thus, a negative pressure for sucking in a gas acts on an intake port. This configuration causes the vacuum suction mechanism of the holder 18 to be sucked onto the workpiece 16. The holder 18 is conveyed by a driving mechanism of the holder 18 while holding the workpiece 16. Thus, the workpiece 16 is conveyed. The conveyance speed of the workpiece 16 can be controlled by adjusting the conveyance speed of the driving mechanism of the holder 18. For example, the workpiece 16 is conveyed at a uniform speed while floating over the flotation unit 10. Thus, the workpiece 16 passes through an irradiation position of a laser beam at a constant speed.

The workpiece 16 is irradiated with the laser beam 15 (hereinafter, the irradiation position of the laser beam is also denoted by the reference numeral 15). For example, the laser irradiation apparatus is a laser annealing apparatus. In this case, an excimer laser or the like can be used as a laser generating device 14. A laser beam supplied from the laser generating device 14 is given a line shape by an optical system (not illustrated), and the workpiece 16 is irradiated with the line-shaped laser beam 15 (line beam) that, specifically, has a focal point extending in the y-axis direction. The workpiece is, for example, an amorphous film formed on a substrate. This amorphous film is irradiated with the laser beam 15 to be annealed, and thus the amorphous film can be crystallized.

As illustrated in FIGS. 5 and 6, the flotation unit 10 is constituted by precision flotation units 11a and 11b, quasi-precision flotation units 12a to 12d, and rough flotation units 13a to 13f. In the following, regions composed of the precision flotation units 11a and 11b are also referred to as precision float regions 11a and 11b, respectively; regions composed of the quasi-precision flotation units 12a to 12d are also referred to as quasi-precision float regions 12a to 12d, respectively; and regions composed of the rough flotation units 13a to 13f are also referred to as rough float regions 13a to 13f, respectively.

The precision flotation units 11a and 11b are disposed in a region (precision float region) that includes the irradiation position 15 of the laser beam. The quasi-precision flotation units 12a and 12b are disposed adjacent to the precision flotation units 11a and 11b and upstream from the precision flotation units 11a and 11b in the conveyance direction of the workpiece 16 (i.e., on the negative side in the x-axis direction). The rough flotation units 13a to 13c are disposed adjacent to the quasi-precision flotation units 12a and 12b and upstream from the quasi-precision flotation units 12a and 12b in the conveyance direction of the workpiece 16 (i.e., on the negative side in the x-axis direction).

The quasi-precision flotation units 12c and 12d are disposed adjacent to the precision flotation units 11a and 11b and downstream from the precision flotation units 11a and 11b in the conveyance direction of the workpiece 16 (i.e., on the positive side in the x-axis direction). The rough flotation units 13d to 13f are disposed adjacent to the quasi-precision flotation units 12c and 12d and downstream from the quasi-precision flotation units 12c and 12d in the conveyance direction of the workpiece 16 (i.e., on the positive side in the x-axis direction).

To rephrase, the precision float regions 11a and 11b are disposed so that the focal point of the laser beam 15 is superposed on the precision float regions 11a and 11b as viewed in a plan view. The rough float regions 13a to 13f are disposed so that the focal point of the laser beam 15 is not superposed on the rough float regions 13a to 13f. Herein, "as viewed in a plan view" means a case in which the flotation unit 10 is viewed in the z-axis direction, as illustrated in FIG. 5. The quasi-precision flotation units 12a and 12b are disposed between the precision float regions 11a and 11b and the rough float regions 13a to 13c. The quasi-precision flotation units 12c and 12d are disposed between the precision float regions 11a and 11b and the rough float regions 13d to 13f.

As illustrated in FIGS. 5 and 6, the precision flotation units 11a and 11b, the quasi-precision flotation units 12a to 12d, and the rough flotation units 13a to 13f are each, for example, a rectangular unit that extends in the y-axis direction, and these flotation units are arrayed in the conveyance direction (x-axis direction). The workpiece 16 is conveyed so as to pass over the rough flotation units 13a to 13c, the quasi-precision flotation units 12a and 12b, the precision flotation units 11a and 11b, the quasi-precision flotation units 12c and 12d, and the rough flotation units 13d to 13f in this order. The shape of each flotation unit is not limited to a rectangular shape. For example, the shape of each flotation unit may be square.

The precision flotation units 11a and 11b convey the workpiece 16 while causing the workpiece 16 to float with high precision. The precision flotation units 11a and 11b are configured to be capable of conveying the workpiece 16 while keeping the deflection amount of the workpiece 16 small during conveyance. The precision flotation units 11a and 11b, for example, control an ejection amount of a gas for causing the workpiece 16 to float with high precision. For example, the precision float regions (precision flotation units) 11a and 11b are configured to cause the workpiece 16 to float by utilizing ejection and suction of a gas.

The rough flotation units 13a to 13f convey the workpiece 16 while causing the workpiece 16 to float. Since it suffices that the workpiece 16 refrain from making contact with the rough flotation units 13a to 13f during conveyance, the rough flotation units 13a to 13f do not control the ejection amount of a gas for causing the workpiece 16 to float with as high precision as that of the precision flotation units 11a and 11b. Therefore, the deflection amount of the workpiece 16 held when the workpiece 16 passes over the rough flotation units 13a to 13f is greater than the deflection amount of the workpiece 16 held when the workpiece 16 passes over the precision flotation units 11a and 11b. For example, the rough float regions (rough flotation units) 13a to 13f are configured to cause the workpiece 16 to float by utilizing ejection of a gas without suction of a gas.

The quasi-precision flotation units 12a and 12b are configured to be capable of conveying the workpiece 16 so that the deflection amount of the workpiece 16 changes smoothly while the workpiece 16 is conveyed from the rough flotation units 13a to 13c to the precision flotation units 11a and 11b. The quasi-precision flotation units 12c and 12d are configured to be capable of conveying the workpiece 16 so that the deflection amount of the workpiece 16 changes smoothly while the workpiece 16 is conveyed from the precision flotation units 11a and 11b to the rough flotation units 13d to 13f. For example, the quasi-precision flotation units 12a to 12d are configured to cause the workpiece 16 to float with a precision that lies between the precision with which the precision flotation units 11a and 11b cause the workpiece 16 to float and the precision with which the rough flotation units 13a to 13f cause the workpiece 16 to float. The quasi-precision float regions (precision flotation units) 12a to 12d are configured to cause the workpiece 16 to float by utilizing ejection and suction of a gas.

For example, the deflection amount of the workpiece 16 held while the workpiece 16 is passing over the precision flotation units 11a and 11b is one-tenth to one-twentieth of the deflection amount of the workpiece 16 held while the workpiece 16 is passing over the rough flotation units 13a to 13c. The quasi-precision flotation units 12a and 12b convey the workpiece 16 so that the deflection amount of the workpiece 16 changes smoothly while the workpiece 16 is being conveyed from the rough flotation units 13a to 13c to the precision flotation units 11a and 11b. To rephrase, the quasi-precision flotation units 12a and 12b convey the workpiece 16 so that the quasi-precision flotation units 12a and 12b absorb the difference between the deflection amount of the workpiece 16 in the rough flotation units 13a to 13c and the deflection amount of the workpiece 16 in the precision flotation units 11a and 11b.

In a similar manner, for example, the deflection amount of the workpiece 16 held while the workpiece 16 is passing over the precision flotation units 11a and 11b is one-tenth to one-twentieth of the deflection amount of the workpiece 16 held while the workpiece 16 is passing over the rough flotation units 13d to 13f. The quasi-precision flotation units 12c and 12d convey the workpiece 16 so that the deflection amount of the workpiece 16 changes smoothly while the workpiece 16 is being conveyed from the precision flotation units 11a and 11b to the rough flotation units 13d to 13f. To rephrase, the quasi-precision flotation units 12c and 12d convey the workpiece 16 so that the quasi-precision flotation units 12c and 12d absorb the difference between the deflection amount of the workpiece 16 in the precision flotation units 11a and 11b and the deflection amount of the workpiece 16 in the rough flotation units 13d to 13f.

(Configuration Example of Precision Flotation Unit)

Figure 7:
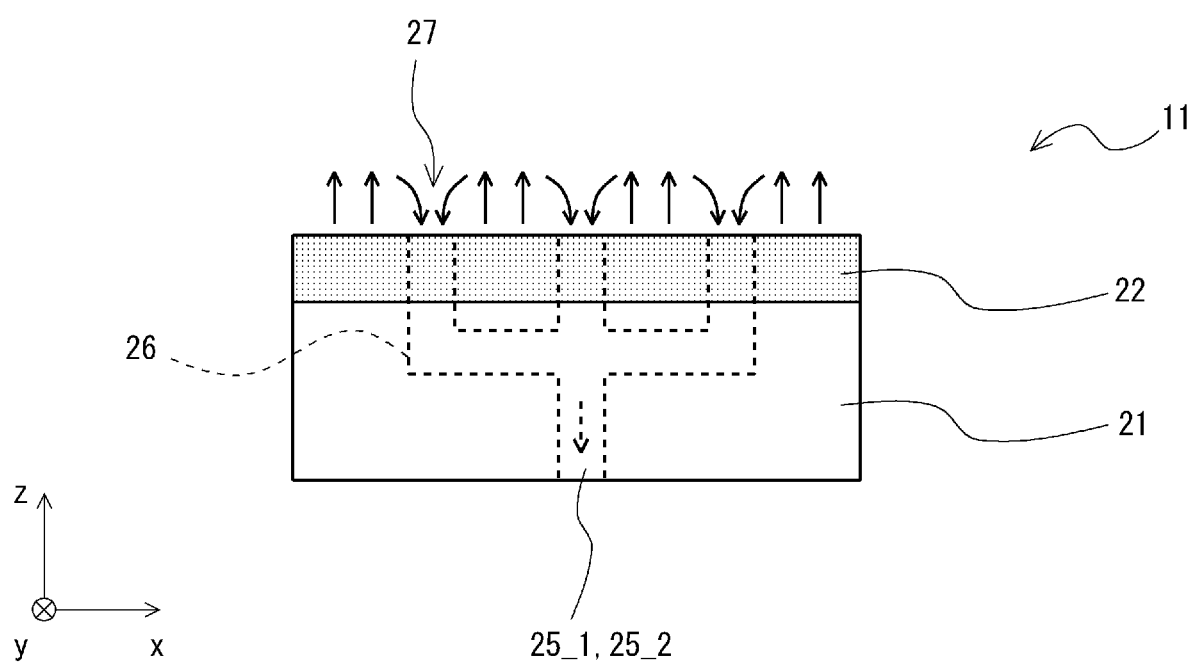
FIG. 7 is a sectional view for describing a configuration example of a precision flotation unit.
Figure 8:
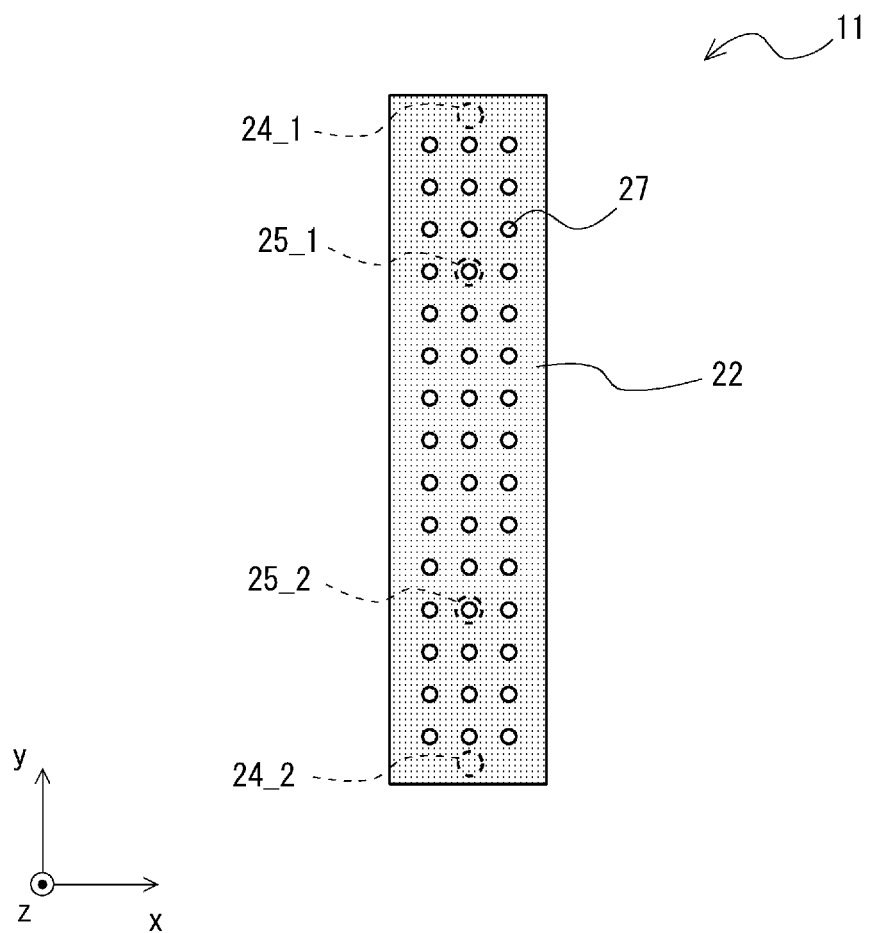
FIG. 8 is a plan view for describing a configuration example of a precision flotation unit.

FIGS. 7 and 8 are, respectively, a sectional view and a plan view for describing a configuration example of the precision flotation unit 11. In the following, the precision flotation units 11a and 11b are also referred to collectively as a precision flotation unit 11. The same applies to a quasi-precision flotation unit 12 and a rough flotation unit 13. A configuration example of the precision flotation unit 11 will be described below, and the configuration of the quasi-precision flotation unit 12 is basically similar to the configuration of the precision flotation unit 11.

As illustrated in FIG. 7, the precision flotation unit 11 includes a pedestal 21 and a porous member 22. The porous member 22 is provided on an upper side of the pedestal 21 and functions as a gas ejecting unit. As illustrated in the plan view in FIG. 8, the porous member 22 is coupled to feeding ports 24_1 and 24_2, and a compressed gas is fed to the porous member 22 via the feeding ports 24_1 and 24_2. For example, the feeding ports 24_1 and 24_2 are provided in a lower portion of the precision flotation unit 11. In the sectional view illustrated in FIG. 7, the locations of the feeding ports 24_1 and 24_2 overlap the locations of discharging ports 25_1 and 25_2, and thus the feeding ports 24_1 and 24_2 are not depicted. The compressed gas fed to the porous member 22 passes through the interior of the porous member 22 and is then ejected upward from the upper surface of the porous member 22. Thus, the workpiece 16 floats.

A plurality of intake pores 27 are formed in the porous member 22. The intake pores 27 can be formed by making through-holes in the porous member 22. As illustrated in FIG. 8, the intake pores 27 are disposed evenly in the upper surface of the porous member 22 (i.e., the surface that opposes the workpiece 16). The intake pores 27 suck in a gas present between the workpiece 16 and the precision flotation unit 11 (see FIG. 9). The intake pores 27 are coupled to the discharging ports 25_1 and 25_2 via a flow channel 26. For example, the discharging ports 25_1 and 25_2 are provided in a lower portion of the precision flotation unit 11. An ejector, a vacuum pump, or the like is coupled to the discharging ports 25_1 and 25_2, and sucking through the discharging ports 25_1 and 25_2 (i.e., creating a negative pressure therein) with the use of the ejector, the vacuum pump, or the like allows a gas present over the upper surface of the precision flotation unit 11 to be sucked in through the intake pores 27.

Figure 9:
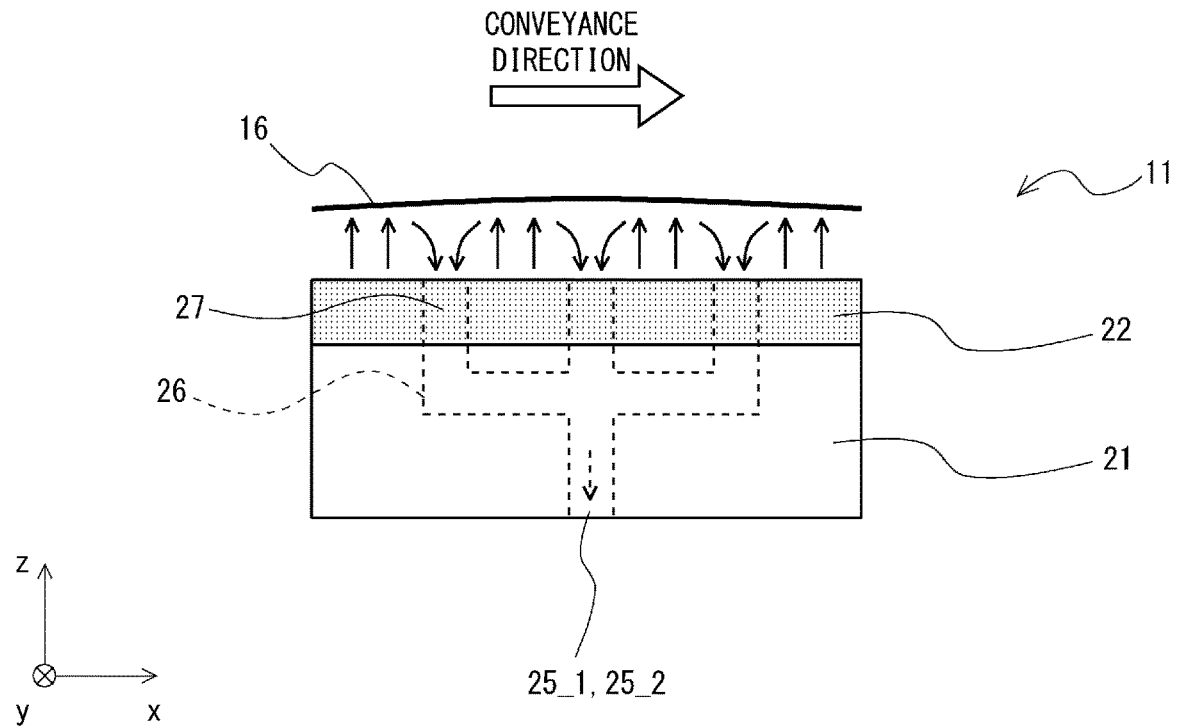
FIG. 9 is a sectional view for describing a state in which a workpiece is being conveyed with the use of a precision flotation unit.

FIG. 9 is a sectional view for describing a state in which the workpiece 16 is being conveyed with the use of the precision flotation unit 11. As illustrated in FIG. 9, a gas is being ejected upward from the porous member 22 in the precision flotation unit 11. Thus, as the workpiece 16 is conveyed to a space above the precision flotation unit 11, the aforementioned gas collides with the lower surface of the workpiece 16 to cause the workpiece 16 to float. This creates a state in which the precision flotation unit 11 and the workpiece 16 are not making contact with each other. At this point, the space between the workpiece 16 and the precision flotation unit 11, that is, the floating amount of the workpiece 16 can be controlled by adjusting the amount of the gas fed to the feeding ports 24_1 and 24_2. To rephrase, the floating amount of the workpiece 16 can be controlled by adjusting the amount of the gas ejected from the porous member 22.

In addition, deflection of the workpiece 16 can be reduced by sucking in a gas present between the workpiece 16 and the precision flotation unit 11 (i.e., gas accumulation (see the reference numeral 35 in FIG. 12)) through the intake pores 27. To rephrase, the workpiece 16 can be made flat. The deflection amount of the workpiece 16 can be controlled by adjusting a balance between the amount of the gas fed to the feeding ports 24_1 and 24_2 and the amount of the gas discharged through the discharging ports 25_1 and 25_2.

(Configuration Example of Rough Flotation Unit)

Figure 10:
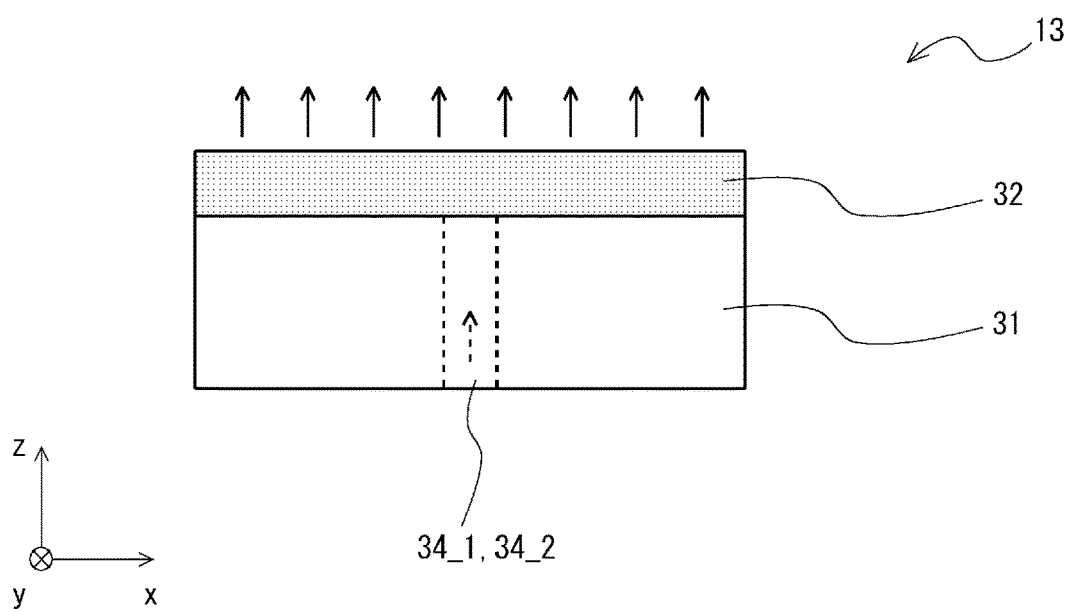
FIG. 10 is a sectional view for describing a configuration example of a rough flotation unit.
Figure 11:
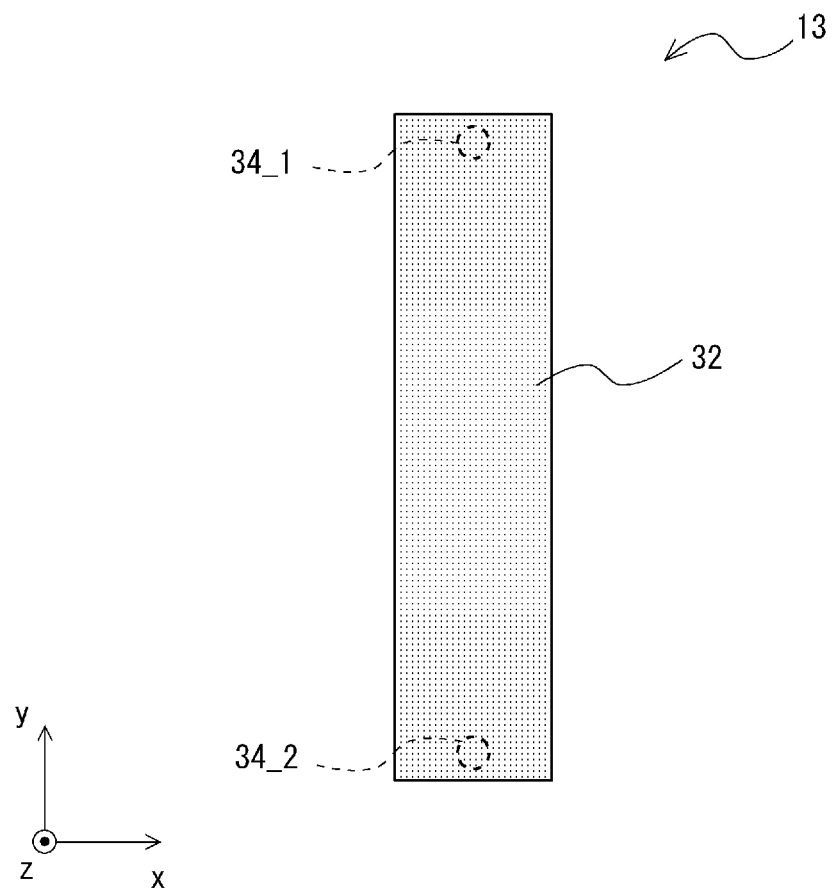
FIG. 11 is a plan view for describing a configuration example of a rough flotation unit.

Next, a configuration example of the rough flotation units 13a to 13f will be described. FIGS. 10 and 11 are, respectively, a sectional view and a plan view for describing the configuration example of the rough flotation unit 13. As illustrated in FIG. 10, the rough flotation unit 13 includes a pedestal 31 and a porous member 32. The porous member 32 is provided on an upper side of the pedestal 31 and functions as a gas ejecting unit. The porous member 32 is coupled to feeding ports 34_1 and 34_2, and a compressed gas is fed to the porous member 32 via the feeding ports 34_1 and 34_2. For example, the feeding ports 34_1 and 34_2 are provided in a lower portion of the rough flotation unit 13. The compressed gas fed to the porous member 32 passes through the interior of the porous member 32 and is then ejected upward from the upper surface of the porous member 32. Thus, the workpiece 16 floats.

Figure 12:
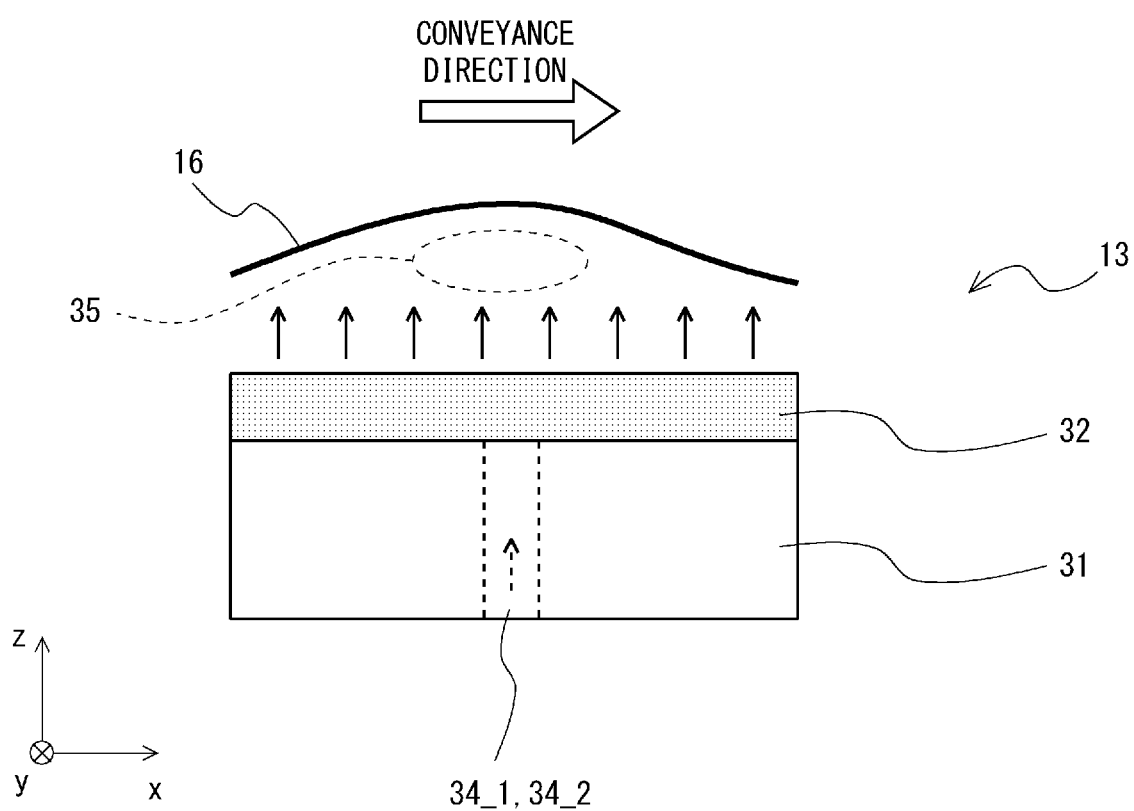
FIG. 12 is a sectional view for describing a state in which a workpiece is being conveyed with the use of a rough flotation unit.

FIG. 12 is a sectional view for describing a state in which the workpiece 16 is being conveyed with the use of the rough flotation unit 13. As illustrated in FIG. 12, a gas is being ejected upward from the porous member 32 in the rough flotation unit 13. Thus, as the workpiece 16 is conveyed to a space above the rough flotation unit 13, the aforementioned gas collides with the lower surface of the workpiece 16 to cause the workpiece 16 to float. This creates a state in which the rough flotation unit 13 and the workpiece 16 are not making contact with each other. At this point, a gas accumulation 35 is created between the workpiece 16 and the rough flotation unit 13. Therefore, the deflection amount of the workpiece 16 is large in the rough flotation unit 13.

Meanwhile, in the precision flotation unit 11 described above, a gas accumulation present between the workpiece 16 and the precision flotation unit 11 is sucked in through the intake pores 27, and thus the deflection amount of the workpiece 16 can be reduced.

In the rough flotation unit 13 as well, the space between the workpiece 16 and the rough flotation unit 13, that is, the floating amount of the workpiece 16 can be controlled by adjusting the amount of the gas fed to the feeding ports 34_1 and 34_2. To rephrase, the floating amount of the workpiece 16 can be controlled by adjusting the amount of the gas ejected from the porous member 32. In the rough flotation unit 13, however, the deflection amount of the workpiece 16 during conveyance is not important since it suffices that the workpiece 16 can be conveyed so that the workpiece 16 refrains from colliding with the rough flotation unit 13. In other words, in the rough flotation unit 13, the amount of the gas fed to the feeding ports 34_1 and 34_2 need not be controlled with as high precision as that in the precision flotation unit 11 or in the quasi-precision flotation unit 12.

In the present embodiment, the flatness of the surfaces of the precision flotation units 11a and 11b that are to oppose the workpiece 16 is smaller than the flatness of the surfaces of the rough flotation units 13a to 13f that are to oppose the workpiece 16. In addition, the flatness of the surfaces of the quasi-precision flotation units 12a to 12d that are to oppose the workpiece 16 is greater than the flatness of the surfaces of the precision flotation units 11a and 11b that are to oppose the workpiece 16 and smaller than the flatness of the surfaces of the rough flotation units 13a to 13f that are to oppose the workpiece 16. For example, the flatness of the precision flotation unit 11, the quasi-precision flotation unit 12, and the rough flotation unit 13 is the flatness of the upper surface of the porous member in each of the flotation units.

For example, the flatness of the precision flotation unit 11 can be defined by the floating amount (floating height) of the workpiece 16 floating over the precision flotation unit 11 and the deflection amount of the workpiece 16. The method of determining the flatness of the flotation unit is similar to that in the case described in the first embodiment, and thus duplicate descriptions thereof will be omitted.

(Description of Piping System in Rough Flotation Unit)

Figure 13:
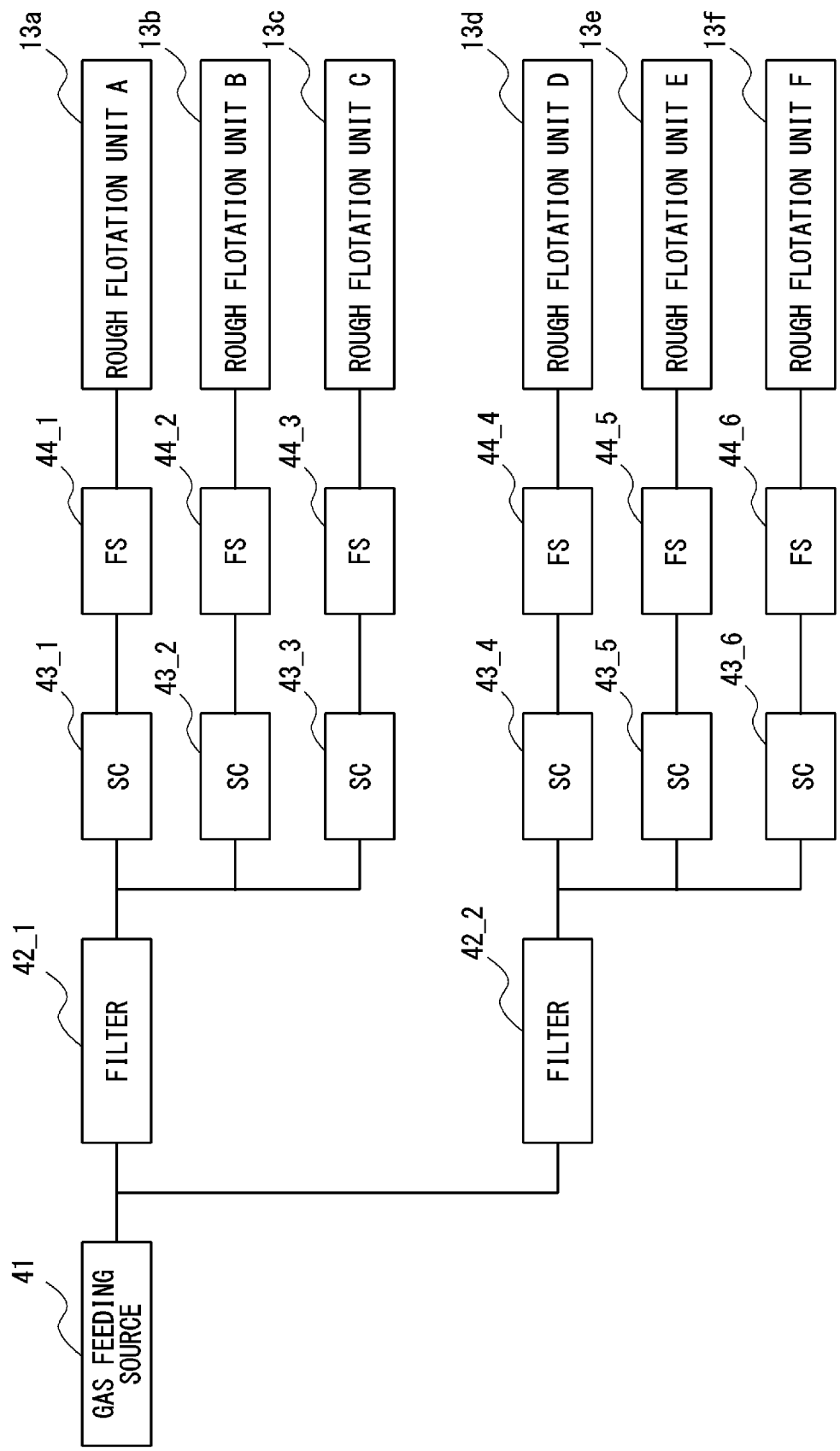
FIG. 13 is a block diagram for describing an example of a piping system (feeding system) in a rough flotation unit.

FIG. 13 is a block diagram for describing an example of a piping system (feeding system) in the rough flotation units 13a to 13f. As illustrated in FIG. 13, a compressed gas fed to a pipe from a gas feeding source 41 branches into two systems and is fed to each of a filter 42_1 and a filter 42_2. For example, a compressed inert gas (e.g., compressed nitrogen gas) or compressed air can be used as the compressed gas.

The filter 42_1 removes moisture and impurity contained in the compressed gas fed from the gas feeding source 41. The compressed gas that has passed through the filter 42_1 branches into three systems and is fed to each of speed controllers (SC) 43_1 to 43_3. The speed controllers 43_1 to 43_3 adjust the flow rate of the compressed gas flowing in the respective speed controllers 43_1 to 43_3. The adjusted compressed gas is fed to the feeding ports 34_1 and 34_2 (see FIG. 11) of each of the rough flotation units 13a to 13c via flow sensors 44_1 to 44_3. The flow sensors 44_1 to 44_3 display the flow rate of the compressed gas fed to the respective rough flotation units 13a to 13c.

The filter 42_2 removes moisture and impurity contained in the compressed gas fed from the gas feeding source 41. The compressed gas that has passed through the filter 42_2 branches into three systems and is fed to speed controllers 43_4 to 43_6. The speed controllers 43_4 to 43_6 adjust the flow rate of the compressed gas flowing in the respective speed controllers 43_4 to 43_6. The adjusted compressed gas is fed to the feeding ports 34_1 and 34_2 (see FIG. 11) of each of the rough flotation units 13d to 13f via flow sensors 44_4 to 44_6. The flow sensors 44_4 to 44_6 display the flow rate of the compressed gas fed to the respective rough flotation units 13d to 13f.

In the example of the piping system illustrated in FIG. 13, a case in which the compressed gas fed to one rough flotation unit is controlled with the use of one speed controller is illustrated. Alternatively, it is not necessary to independently control each of the rough flotation units 13a to 13f since it suffices that the rough flotation units 13a to 13f can convey the workpiece 16 with the workpiece 16 kept from colliding with the rough flotation units 13a to 13f. For example, in the present embodiment, a compressed gas fed to two rough flotation units may be controlled with the use of one speed controller.

(Description of Piping System (Feeding System) in Precision Flotation Unit and Quasi-Precision Flotation Unit)

Figure 14:
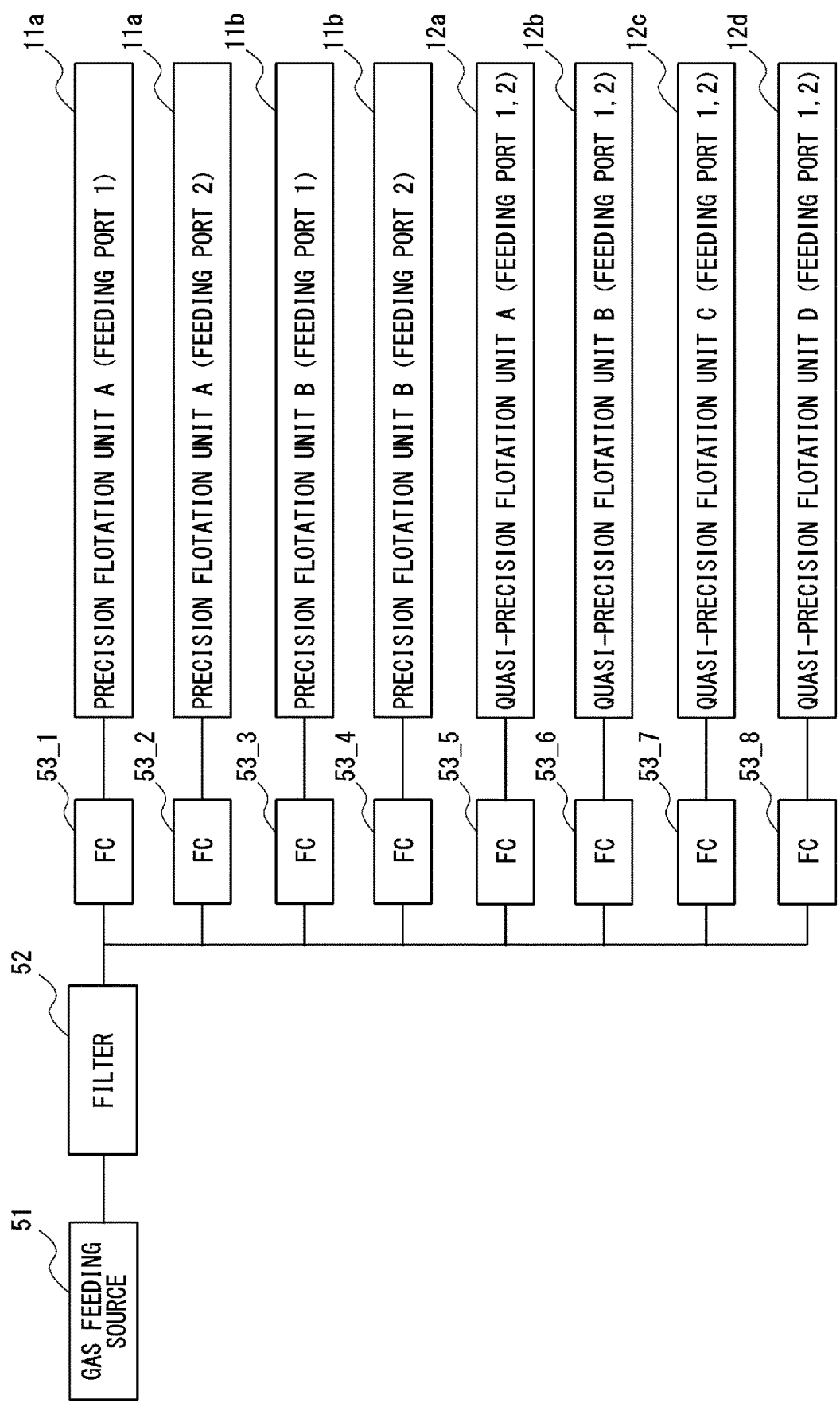
FIG. 14 is a block diagram for describing an example of a piping system (feeding system) in a precision flotation unit and a quasi-precision flotation unit.

FIG. 14 is a block diagram for describing an example of a piping system (feeding system) in the precision flotation units 11a and 11b and the quasi-precision flotation units 12a to 12d. As illustrated in FIG. 14, a compressed gas fed to a pipe from a gas feeding source 51 is fed to a filter 52. For example, a compressed inert gas (e.g., compressed nitrogen gas) or compressed air can be used as the compressed gas.

The filter 52 removes moisture and impurity contained in the compressed gas fed from the gas feeding source 51. The compressed gas that has passed through the filter 52 branches into eight systems and is fed to each of flow controllers 53_1 to 53_8. The flow controllers 53_1 to 53_8 adjust the flow rate of the compressed gas flowing in the respective flow controllers 53_1 to 53_8. For example, a flow sensor having a throttle valve for adjusting the flow rate can be used for the flow controllers 53_1 to 53_8. The adjusted compressed gas is fed to each of the precision flotation units 11a and 11b and each of the quasi-precision flotation units 12a to 12d.

Specifically, the compressed gas having its flow rate controlled by the flow controller 53_1 is fed to a feeding port 1 (corresponding to the feeding port 24_1 illustrated in FIG. 8, the same applies hereinafter) of the precision flotation unit 11a. The compressed gas having its flow rate controlled by the flow controller 53_2 is fed to a feeding port 2 (corresponding to the feeding port 24_2 illustrated in FIG. 8, the same applies hereinafter) of the precision flotation unit 11a. The compressed gas having its flow rate controlled by the flow controller 53_3 is fed to a feeding port 1 of the precision flotation unit 11b. The compressed gas having its flow rate controlled by the flow controller 53_4 is fed to a feeding port 2 of the precision flotation unit 11b.

The compressed gas having its flow rate controlled by the flow controller 53_5 is fed to two feeding ports 1 and 2 (corresponding to the feeding ports 24_1 and 24_2 illustrated in FIG. 8, the same applies hereinafter) of the quasi-precision flotation unit 12a. The compressed gas having its flow rate controlled by the flow controller 53_6 is fed to two feeding ports 1 and 2 of the quasi-precision flotation unit 12b. The compressed gas having its flow rate controlled by the flow controller 53_7 is fed to two feeding ports 1 and 2 of the quasi-precision flotation unit 12c. The compressed gas having its flow rate controlled by the flow controller 53_8 is fed to two feeding ports 1 and 2 of the quasi-precision flotation unit 12d.

In this manner, in the quasi-precision flotation units 12a to 12d, a compressed gas flowing into one quasi-precision flotation unit (having two feeding ports) is controlled with the use of one flow controller. In contrast, in the precision flotation units 11a and 11b, a compressed gas flowing into one precision flotation unit is controlled with the use of two flow controllers. To rephrase, a compressed gas flowing to one feeding port of the precision flotation unit is controlled with the use of one flow controller. Accordingly, the flow rate of the compressed gas can be controlled with a higher precision in the precision flotation units 11a and 11b than in the quasi-precision flotation units 12a to 12d.

(Description of Piping System (Discharging System) in Precision Flotation Unit and Quasi-Precision Flotation Unit)

Figure 15:
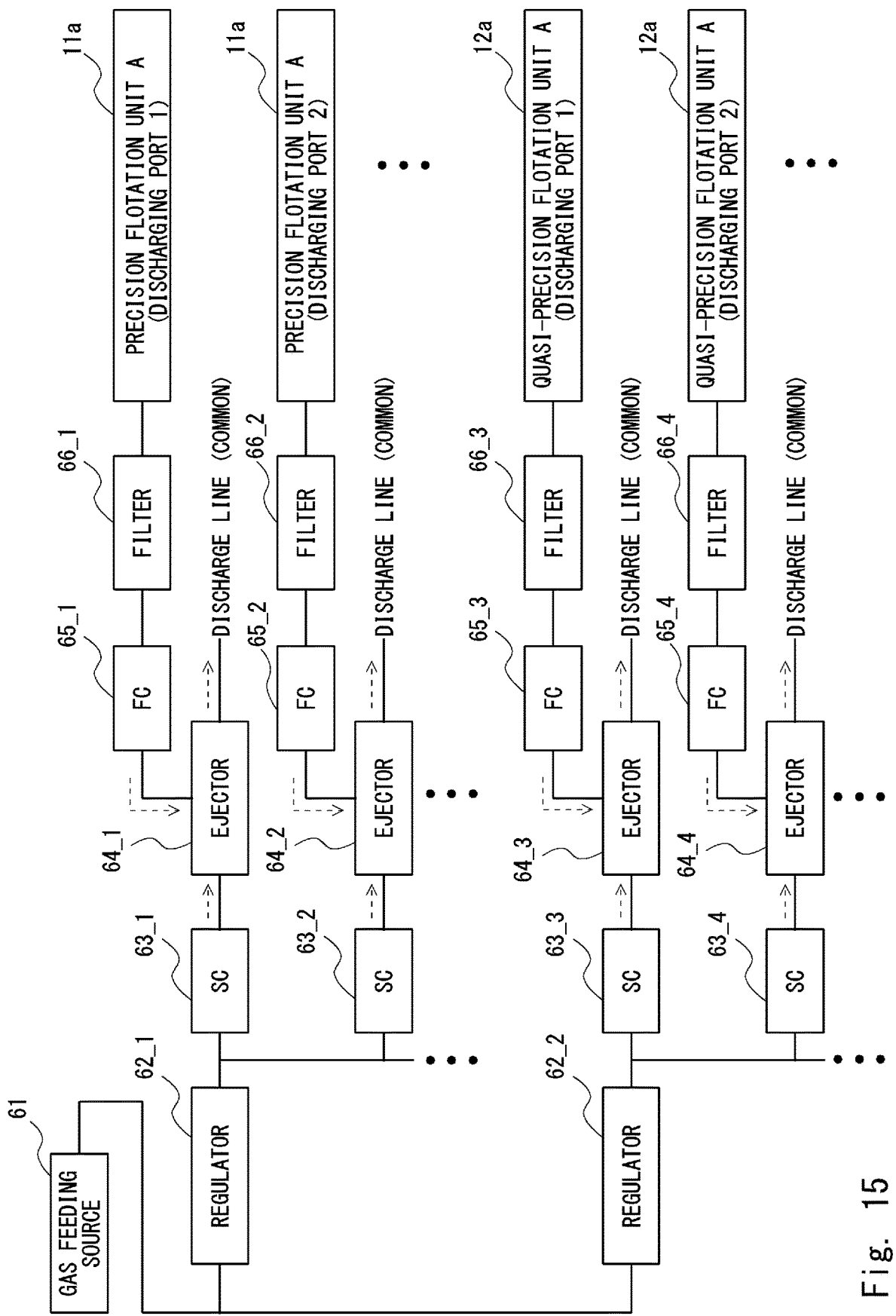
FIG. 15 is a block diagram for describing an example of a piping system (discharging system) in a precision flotation unit and a quasi-precision flotation unit.

FIG. 15 is a block diagram for describing an example of a piping system (discharging system) in the precision flotation units 11a and 11b and the quasi-precision flotation units 12a to 12d. As illustrated in FIG. 15, a compressed gas fed to a pipe from a gas feeding source 61 is fed to each of a regulator 62_1 and a regulator 62_2. For example, compressed air or a compressed inert gas (e.g., compressed nitrogen gas) can be used as the compressed gas.

The regulator 62_1 is provided in the system for the precision flotation units 11a and 11b and adjusts the pressure of the compressed gas fed from the gas feeding source 61. The compressed gas that has passed through the regulator 62_1 is fed to a speed controller 63_1. The speed controller 63_1 adjusts the flow rate of the compressed gas flowing in the speed controller 63_1. The adjusted compressed gas flows into a discharge line via an ejector 64_1. Thus, a negative pressure is produced in a pipe coupling the ejector 64_1 and a flow controller 65_1. In FIG. 15, the flows of the gas in the vicinity of ejectors 64_1 to 64_4 are indicated by arrows. The flow controller 65_1 and a filter 66_1 are provided between the ejector 64_1 and a discharging port 1 (corresponding to the discharging port 35_1 illustrated in FIG. 8) of the precision flotation unit 11a, and the discharge amount in the discharging port 1 of the precision flotation unit 11a can be adjusted with the use of the flow controller 65_1.

The above description similarly applies to a system provided with a speed controller 63_2, the ejector 64_2, a flow controller 65_2, and a filter 66_2, and the discharge amount in a discharging port 2 (corresponding to the discharging port 35_2 illustrated in FIG. 8) of the precision flotation unit 11a can be adjusted with the use of the flow controller 65_2. Although illustration is omitted in FIG. 15, the same applies to the piping system in the precision flotation unit 11b.

The regulator 62_2 is provided in the system for the quasi-precision flotation units 12a to 12d and adjusts the pressure of the compressed gas fed from the gas feeding source 61. The configuration of the system for the quasi-precision flotation units 12a to 12d is similar to the configuration of the system for the precision flotation unit 11a described above, and thus duplicate descriptions thereof will be omitted. In addition, although illustration is omitted in FIG. 15, the same applies to the piping system in the quasi-precision flotation units 12b to 12d.

In the example of the piping system (discharging system) in the precision flotation units 11a and 11b and the quasi-precision flotation units 12a to 12d illustrated in FIG. 15, the discharge amount of each of the two discharging ports provided in each of the precision flotation units 11a and 11b and the quasi-precision flotation units 12a to 12d can be adjusted independently. Accordingly, the discharge amount in each flotation unit can be adjusted with high precision.

As described thus far, in the laser irradiation apparatus according to the present embodiment, the amount of gas to be fed to the feeding ports of the precision flotation units 11a and 11b and the amount of gas to be fed to the quasi-precision flotation units 12a to 12d can each be controlled independently. In addition, the amount of gas to be sucked in through the intake pores in the precision flotation units 11a and 11b (the discharge amount in the discharging ports) and the amount of gas to be sucked in through intake pores in the quasi-precision flotation units 12a to 12d (the discharge amount in the discharging ports) can each be controlled independently.

(Description of State in which Workpiece is Conveyed)

Figure 16:
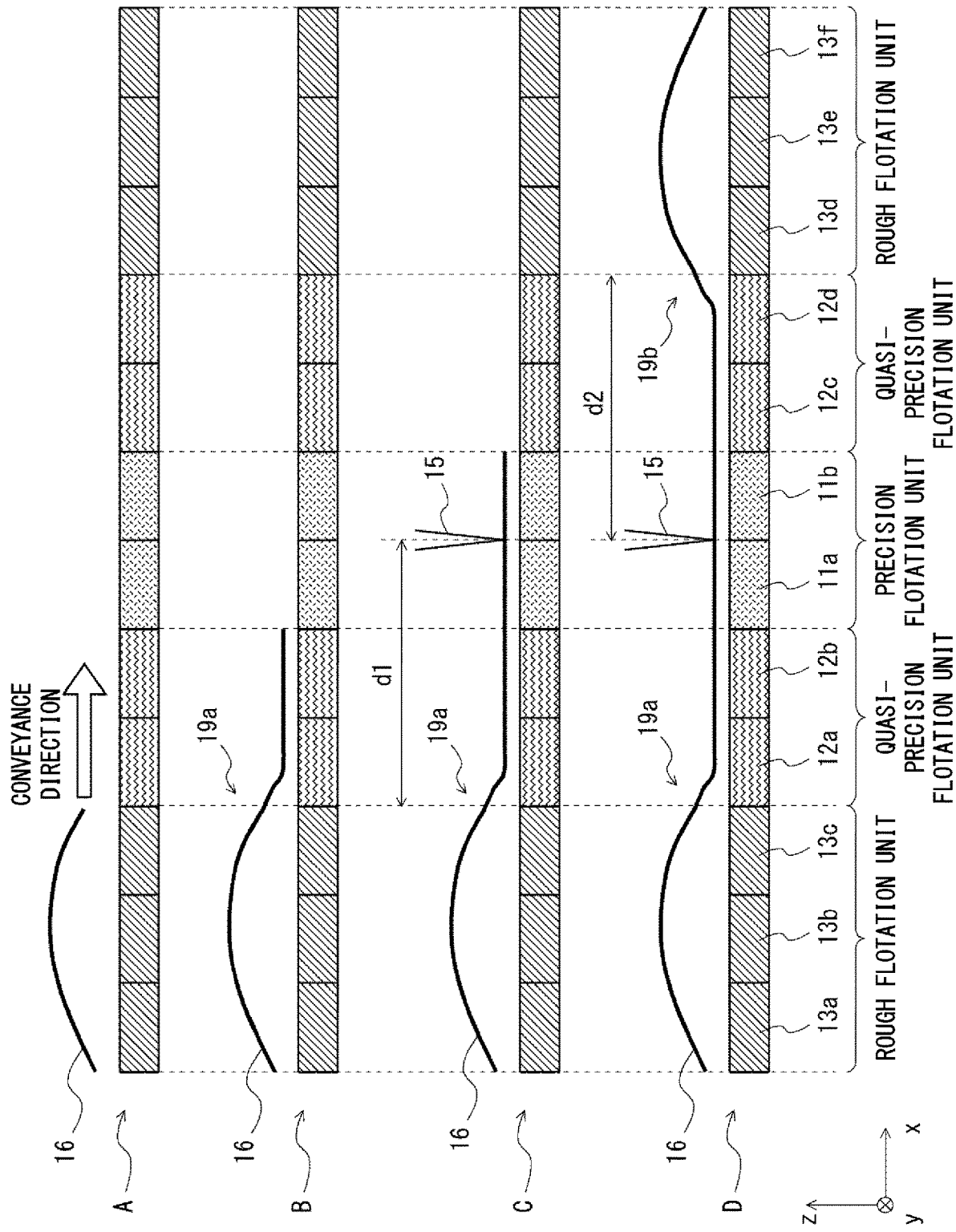
FIG. 16 is a sectional view for describing a state in which a workpiece is being conveyed with the use of the laser irradiation apparatus according to the second embodiment.

FIG. 16 is a sectional view for describing a state in which the workpiece 16 is being conveyed with the use of the laser irradiation apparatus 1 according to the present embodiment. As illustrated in FIG. 16A, the deflection amount of the workpiece 16 is large while the workpiece 16 is passing over the rough flotation units 13a to 13c. This is because the gas accumulation 35 is created between the workpiece 16 and the rough flotation units 13a to 13c while the workpiece 16 is passing over the rough flotation units 13a to 13c, as illustrated in FIG. 12.

Thereafter, the workpiece 16 is conveyed, and while the workpiece 16 is passing over the quasi-precision flotation units 12a and 12b, as illustrated in FIG. 16B, the deflection amount of the workpiece 16 is smaller than the deflection amount thereof held while the workpiece 16 is passing over the rough flotation units 13a to 13c. This is because the deflection of the workpiece 16 can be reduced by sucking in the gas present between the workpiece 16 and the quasi-precision flotation units 12a and 12b (i.e., the gas accumulation 35 (see FIG. 12)) through the intake pores 27 (see FIG. 9).

Thereafter, the workpiece 16 is further conveyed, and while the workpiece 16 is passing over the precision flotation units 11a and 11b, as illustrated in FIG. 16C, the deflection amount of the workpiece 16 is smaller than the deflection amount thereof held while the workpiece 16 is passing over the quasi-precision flotation units 12a and 12b. This is because the deflection of the workpiece 16 can be reduced by sucking in the gas present between the workpiece 16 and the precision flotation units 11a and 11b (i.e., the gas accumulation 35 (see FIG. 12)) through the intake pores 27 (see FIG. 9). In addition, providing the quasi-precision flotation units 12a and 12b allows the deflection amount of the workpiece 16 to change smoothly while the workpiece 16 is being conveyed from the rough flotation units 13a to 13c to the precision flotation units 11a and 11b. The workpiece 16 is irradiated with the laser beam 15 while passing over the precision flotation units 11a and 11b.

Thereafter, the workpiece 16 is further conveyed, and while the workpiece 16 is passing over the quasi-precision flotation units 12c and 12d and the rough flotation units 13d to 13f, as illustrated in FIG. 16D, the deflection amount of the workpiece 16 changes as follows. Specifically, the deflection amount of the workpiece 16 is large while the workpiece 16 is passing over the rough flotation units 13d to 13f. This is because the gas accumulation 35 is created between the workpiece 16 and the rough flotation units 13d to 13f while the workpiece 16 is passing over the rough flotation units 13d to 13f, as illustrated in FIG. 12.

In addition, while the workpiece 16 is passing over the quasi-precision flotation units 12c and 12d, the deflection amount of the workpiece 16 is smaller than the deflection amount thereof held while the workpiece 16 is passing over the rough flotation units 13d to 13f. This is because the deflection of the workpiece 16 can be reduced by sucking in the gas present between the workpiece 16 and the quasi-precision flotation units 12c and 12d (i.e., the gas accumulation 35 (see FIG. 12)) through the intake pores 27 (see FIG. 9). In this case as well, providing the quasi-precision flotation units 12c and 12d allows the deflection amount of the workpiece 16 to change smoothly while the workpiece 16 is being conveyed from the precision flotation units 11a and 11b to the rough flotation units 13d to 13f.

In this manner, in the laser irradiation apparatus 1 according to the present embodiment, the quasi-precision flotation units 12a and 12b are provided between the rough flotation units 13a to 13c and the precision flotation units 11a and 11b. Accordingly, the deflection amount of the workpiece 16 can be made to change smoothly while the workpiece 16 is being conveyed from the rough flotation units 13a to 13c to the precision flotation units 11a and 11b.

Specifically, as illustrated in FIG. 16C, the deflection amount of the workpiece 16 changes steeply at a position 19a while the workpiece 16 is being conveyed from the rough flotation unit 13c to the quasi-precision flotation unit 12a. However, in the laser irradiation apparatus 1 according to the present embodiment, the workpiece 16 is conveyed so that the deflection amount of the workpiece 16 changes smoothly with the use of the quasi-precision flotation units 12a and 12b. Accordingly, it becomes possible to suppress an influence of deflection of the workpiece 16 held at the position 19a on the workpiece 16 passing through the laser irradiation position 15. To rephrase, providing the quasi-precision flotation units 12a and 12b makes it possible to increase a distance d1 between the laser irradiation position 15 and the position 19a where deflection of the workpiece 16 is large, and thus deflection of the workpiece 16 to be held at the laser irradiation position 15 can be reduced as compared to the laser irradiation apparatus according to the first embodiment (see FIG. 4).

In addition, in the laser irradiation apparatus 1 according to the present embodiment, the quasi-precision flotation units 12c and 12d are provided between the precision flotation units 11a and 11b and the rough flotation units 13d to 13f. Accordingly, the deflection amount of the workpiece 16 can be made to change smoothly while the workpiece 16 is being conveyed from the precision flotation units 11a and 11b to the rough flotation units 13d to 13f.

Specifically, as illustrated in FIG. 16D, the deflection amount of the workpiece 16 changes steeply at a position 19b while the workpiece 16 is being conveyed from the quasi-precision flotation unit 12d to the rough flotation unit 13d. However, in the laser irradiation apparatus 1 according to the present embodiment, the workpiece 16 is conveyed so that the deflection amount of the workpiece 16 changes smoothly with the use of the quasi-precision flotation units 12c and 12d. Accordingly, it becomes possible to suppress an influence of deflection of the workpiece 16 held at the position 19b on the workpiece 16 passing through the laser irradiation position 15. To rephrase, providing the quasi-precision flotation units 12c and 12d makes it possible to increase a distance d2 between the laser irradiation position 15 and the position 19b where deflection of the workpiece 16 is large, and thus deflection of the workpiece 16 to be held at the laser irradiation position 15 can be reduced as compared to the laser irradiation apparatus according to the first embodiment (see FIG. 4).

In this manner, in the laser irradiation apparatus 1 according to the present embodiment, deflection of the workpiece 16 held at the laser irradiation position 15 can be reduced, and this can thus keep the workpiece 16 from being out of the depth of focus (DOF) of the laser beam at the laser irradiation position 15.

In the case illustrated in FIGS. 5 and 6, the precision float region is composed of the two precision flotation units 11a and 11b, the quasi-precision float region is composed of the four quasi-precision flotation units 12a to 12d, and the rough float region is composed of the six rough flotation units 13a to 13f. In the laser irradiation apparatus 1 according to the present embodiment, however, the number of the precision flotation units 11 composing the rough float region, the number of the quasi-precision flotation units 12 composing the quasi-precision float region, and the number of the rough flotation units 13 composing the rough float region can be determined as desired. The configurations of the precision flotation unit 11, the quasi-precision flotation unit 12, and the rough flotation unit 13 described above are examples, and in the present embodiment, the flotation units may have configurations different from those described above. For example, since the rough flotation unit 13 is not required to have as high floating precision as that of the precision flotation unit 11, the area of the rough flotation unit per unit may be greater than the area of the precision flotation unit per unit. The configuration in which the rough flotation unit is provided with no intake pore has been described above. Alternatively, the rough flotation unit may be provided with an intake pore in the present embodiment.

In the configuration described above, the quasi-precision flotation units 12a and 12b and the quasi-precision flotation units 12c and 12d are provided at the respective sides of the precision flotation units 11a and 11b. Alternatively, in the laser irradiation apparatus 1 according to the present embodiment, it suffices that the quasi-precision flotation unit 12 be provided at least one of the upstream side and the downstream side of the precision flotation units 11a and 11b in the conveyance direction of the workpiece 16.

(Arrangement Example of Each Flotation Unit)

FIGS. 17 to 21 are plan views for describing arrangement examples of the precision flotation unit (precision float region) 11, the quasi-precision flotation unit (quasi-precision float region) 12, and the rough flotation unit (rough float region) 13. The precision flotation unit 11, the quasi-precision flotation unit 12, and the rough flotation unit 13 are disposed on a stage of each of laser irradiation apparatuses 1_1 to 1_5 illustrated in FIGS. 17 to 21, respectively. The workpiece 16 is made to float over the stage, the workpiece 16 is conveyed over the stage in the direction of the arrows with the use of a holder (not illustrated), and the workpiece 16 is thus processed.

Figure 17:
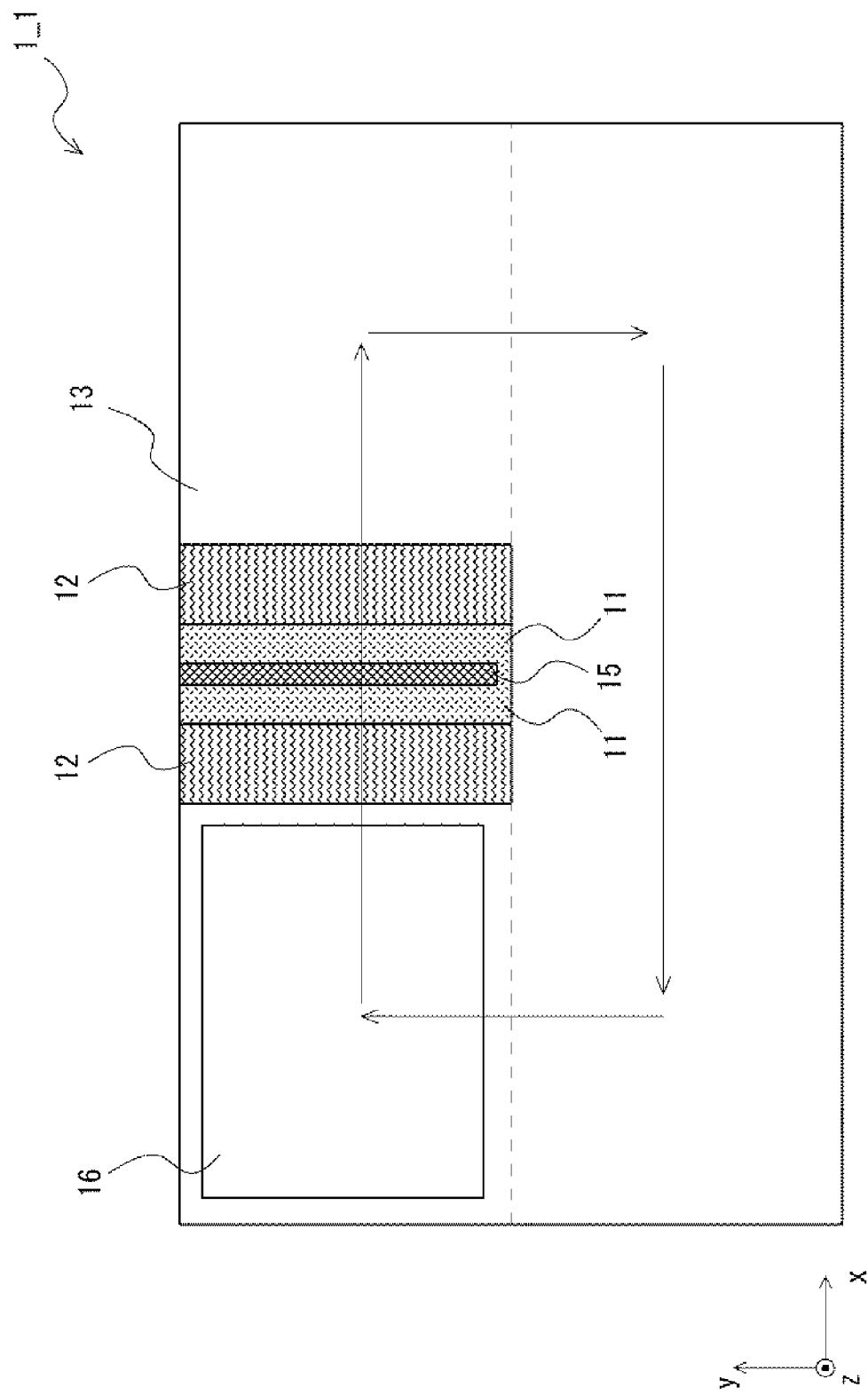
FIG. 17 is a plan view for describing an arrangement example of a precision flotation unit, a quasi-precision flotation unit, and a rough flotation unit.

In the laser irradiation apparatus 1_1 illustrated in FIG. 17, the laser irradiation position 15 extends from a center portion of the stage to an edge portion of the stage in the y-axis direction. To rephrase, the laser irradiation position 15 has approximately the same length as the workpiece 16 in the y-axis direction, and the entire surface of the workpiece 16 in the y-axis direction is irradiated with the laser beam while the workpiece 16 is conveyed. The precision flotation unit 11 is disposed so as to include the laser irradiation position 15. The length of the precision flotation unit 11 in the y-axis direction is approximately the same as the length of the laser irradiation position 15 in the y-axis direction. The quasi-precision flotation unit 12 is disposed on each side of the precision flotation unit 11 in the x-axis direction. The rough flotation unit 13 is disposed on a site other than where the precision flotation unit 11 and the quasi-precision flotation unit 12 are disposed. In the laser irradiation apparatus 1_1 illustrated in FIG. 17, the workpiece 16 may be conveyed over the stage so that the workpiece 16 passes through the laser irradiation position 15 a plurality of times. In other words, the workpiece 16 may be conveyed over the stage so that a given portion of the workpiece 16 is irradiated with the laser beam a plurality of times.

Figure 18:
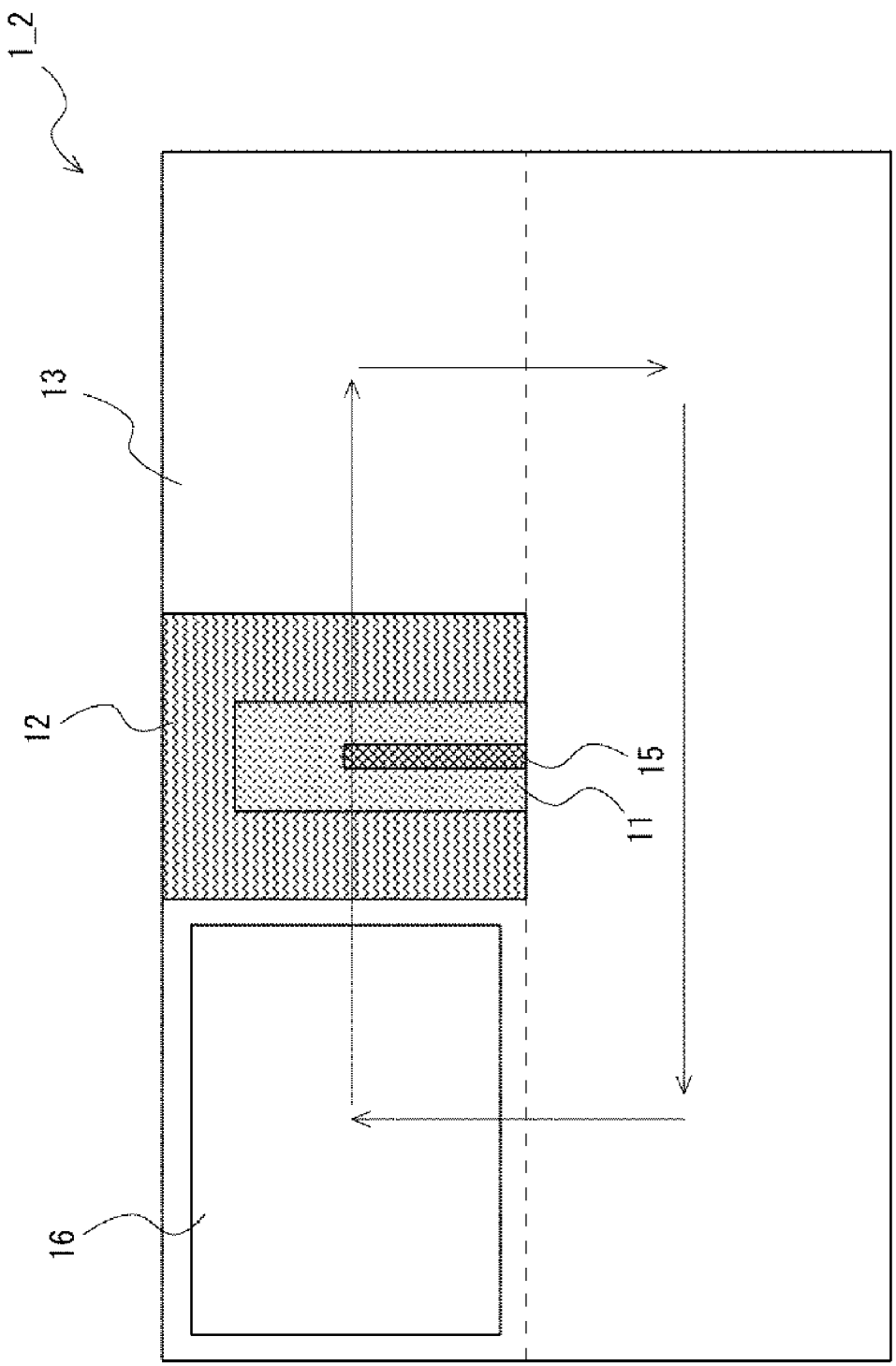
FIG. 18 is a plan view for describing an arrangement example of a precision flotation unit, a quasi-precision flotation unit, and a rough flotation unit.

In the laser irradiation apparatus 1_2 illustrated in FIG. 18, the length of the laser irradiation position 15 in the y-axis direction is approximately one half the length of the workpiece 16 in the y-axis direction. The laser irradiation position 15 is located toward the center portion of the stage, and a half of the region on the workpiece 16 in the y-axis direction is irradiated with the laser beam while the workpiece 16 passes through the laser irradiation position 15. In the laser irradiation apparatus 1_2 illustrated in FIG. 18, the workpiece 16 is conveyed over the stage in the direction of the arrows, and the workpiece 16 is irradiated with the laser beam in multiple batches. Thus, the entire surface of the workpiece 16 can be processed. The precision flotation unit 11 is disposed so as to include the laser irradiation position 15. The quasi-precision flotation unit 12 is disposed so as to surround the precision flotation unit 11 except at the center portion of the stage. The rough flotation unit 13 is disposed on a site other than where the precision flotation unit 11 and the quasi-precision flotation unit 12 are disposed. In the laser irradiation apparatus 1_2 illustrated in FIG. 18, the workpiece 16 may be conveyed over the stage so that the workpiece 16 passes through the laser irradiation position 15 a plurality of times. In other words, the workpiece 16 may be conveyed over the stage so that a given portion of the workpiece 16 is irradiated with the laser beam a plurality of times.

Figure 19:
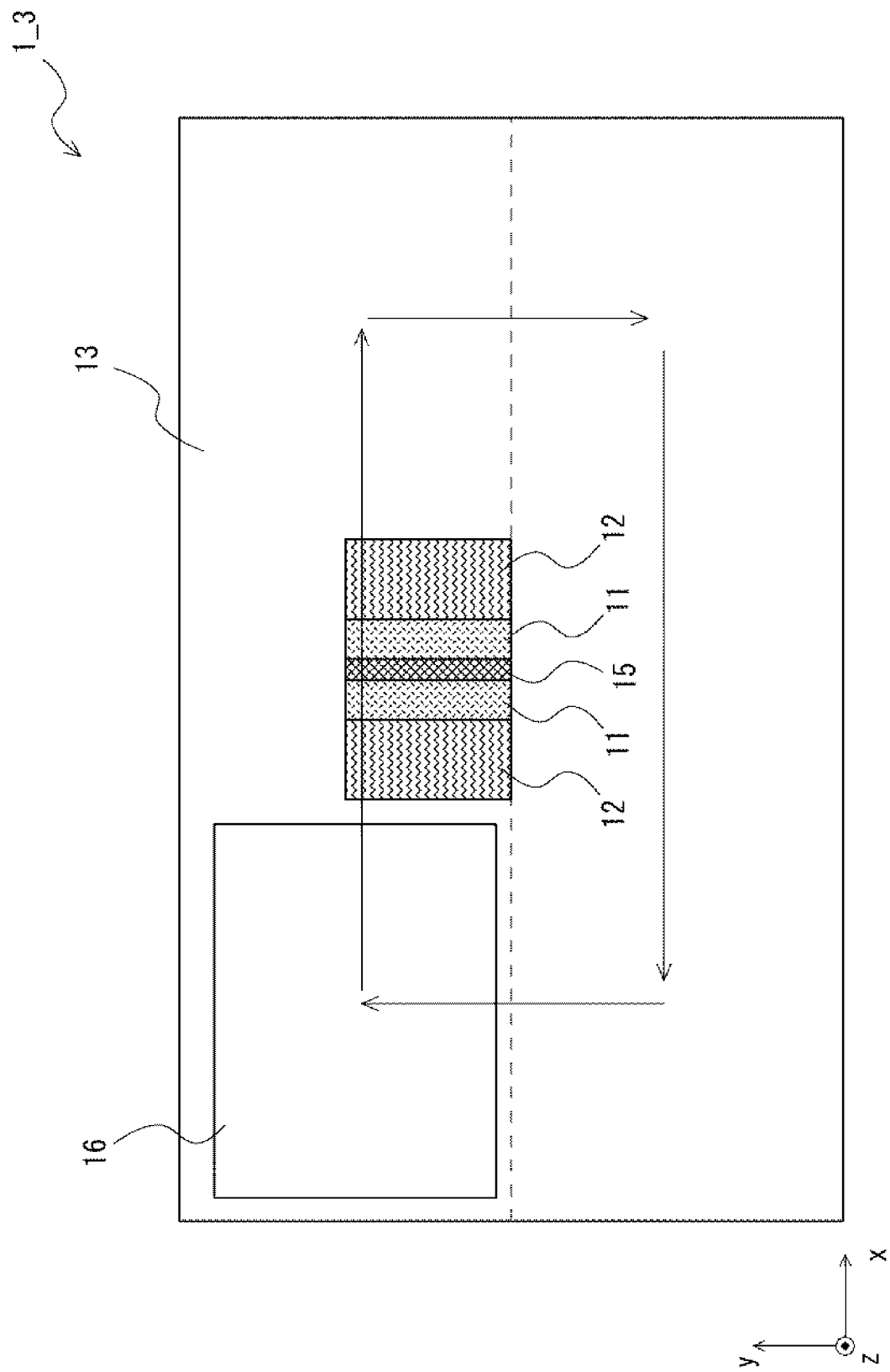
FIG. 19 is a plan view for describing an arrangement example of a precision flotation unit, a quasi-precision flotation unit, and a rough flotation unit.

In the laser irradiation apparatus 1_3 illustrated in FIG. 19, the length of the laser irradiation position 15 in the y-axis direction is approximately one half the length of the workpiece 16 in the y-axis direction. The laser irradiation position 15 is located toward the center portion of the stage, and a half of the region on the workpiece 16 in the y-axis direction is irradiated with the laser beam while the workpiece 16 passes through the laser irradiation position 15. In the laser irradiation apparatus 1_3 illustrated in FIG. 19, the workpiece 16 is conveyed over the stage in the direction of the arrows, and the workpiece 16 is irradiated with the laser beam in multiple batches. Thus, the entire surface of the workpiece 16 can be processed. The precision flotation unit 11 is disposed so as to include the laser irradiation position 15. The length of the precision flotation unit 11 in the y-axis direction is approximately the same as the length of the laser irradiation position 15 in the y-axis direction. The quasi-precision flotation unit 12 is disposed on each side of the precision flotation unit 11 in the x-axis direction. The rough flotation unit 13 is disposed on a site other than where the precision flotation unit 11 and the quasi-precision flotation unit 12 are disposed. In the laser irradiation apparatus 1_3 illustrated in FIG. 19, the workpiece 16 may be conveyed over the stage so that the workpiece 16 passes through the laser irradiation position 15 a plurality of times. In other words, the workpiece 16 may be conveyed over the stage so that a given portion of the workpiece 16 is irradiated with the laser beam a plurality of times.

Figure 20:
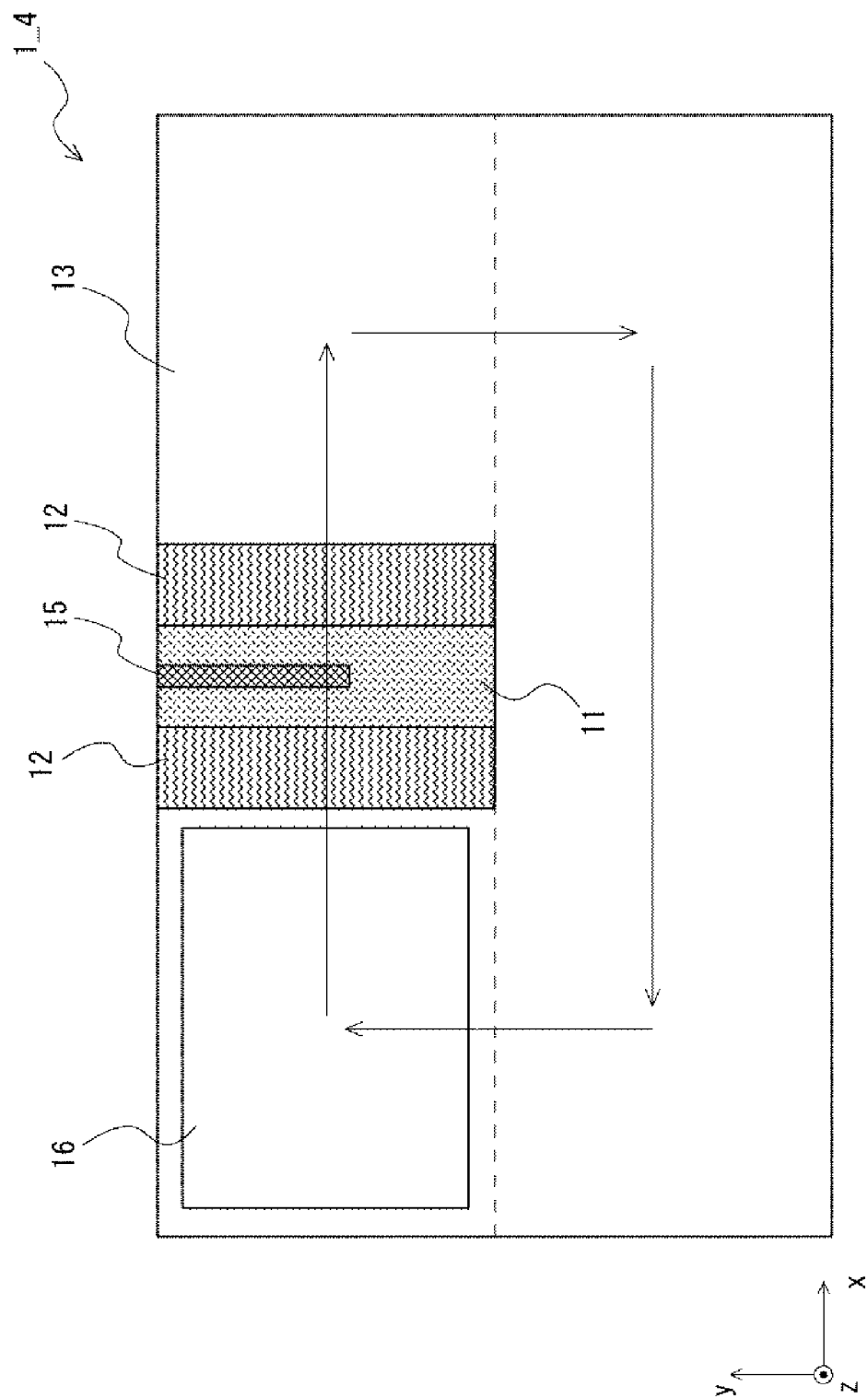
FIG. 20 is a plan view for describing an arrangement example of a precision flotation unit, a quasi-precision flotation unit, and a rough flotation unit.

In the laser irradiation apparatus 1_4 illustrated in FIG. 20, the length of the laser irradiation position 15 in the y-axis direction is approximately one half the length of the workpiece 16 in the y-axis direction. The laser irradiation position 15 is located toward an edge portion of the stage, and a half of the region on the workpiece 16 in the y-axis direction is irradiated with the laser beam while the workpiece 16 passes through the laser irradiation position 15. In the laser irradiation apparatus 1_4 illustrated in FIG. 20, the workpiece 16 is conveyed over the stage in the direction of the arrows, and the workpiece 16 is irradiated with the laser beam in multiple batches. Thus, the entire surface of the workpiece 16 can be processed. The precision flotation unit 11 is disposed so as to include the laser irradiation position 15. The length of the precision flotation unit 11 in the y-axis direction is greater than the length of the laser irradiation position 15 in the y-axis direction. In other words, the precision flotation unit 11 is disposed so as to extend from the center portion of the stage to an edge portion of the stage in the y-axis direction. The quasi-precision flotation unit 12 is disposed on each side of the precision flotation unit 11 in the x-axis direction. The rough flotation unit 13 is disposed on a site other than where the precision flotation unit 11 and the quasi-precision flotation unit 12 are disposed. In the laser irradiation apparatus 1_4 illustrated in FIG. 20, the workpiece 16 may be conveyed over the stage so that the workpiece 16 passes through the laser irradiation position 15 a plurality of times. In other words, the workpiece 16 may be conveyed over the stage so that a given portion of the workpiece 16 is irradiated with the laser beam a plurality of times.

Figure 21:
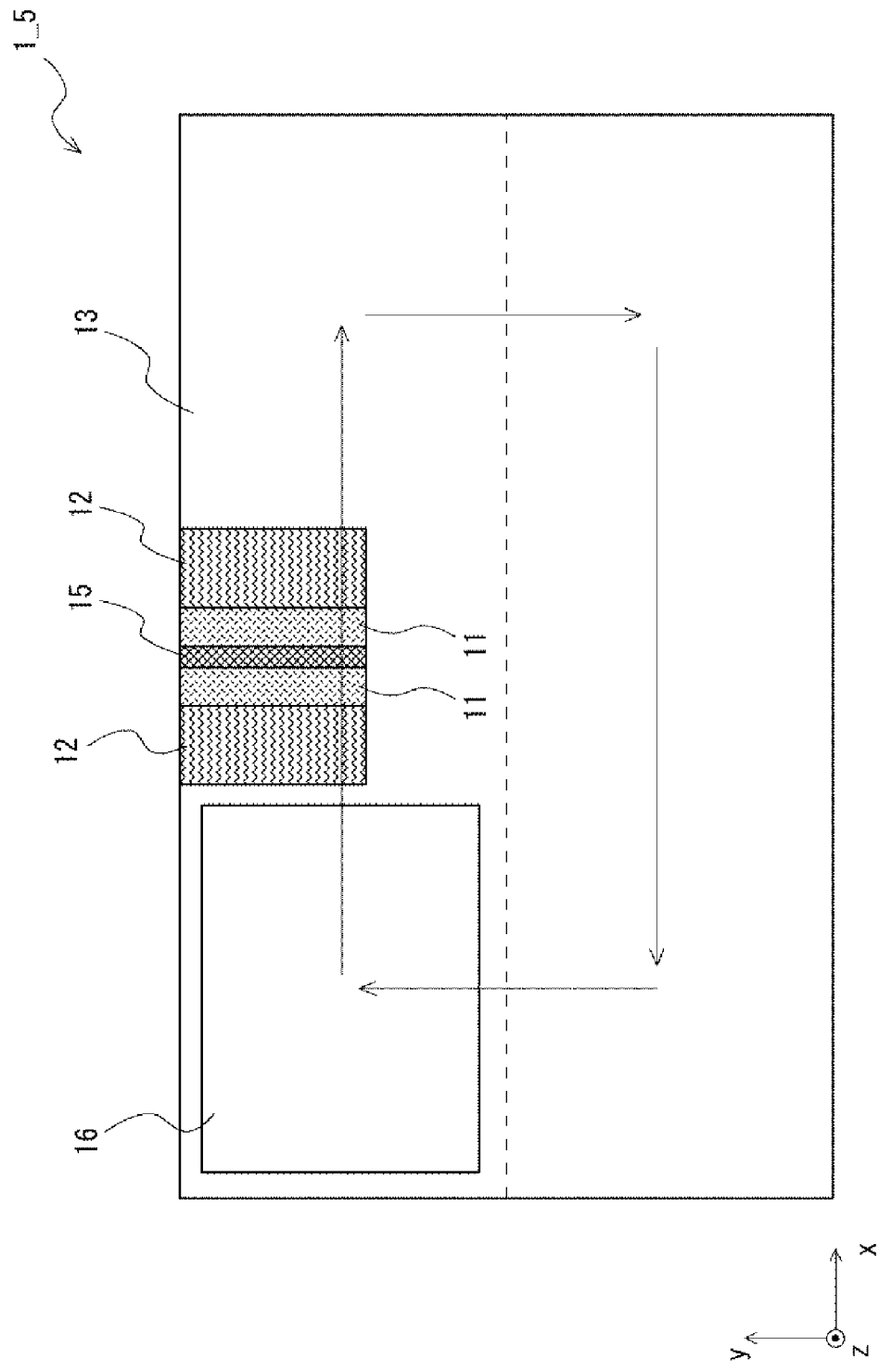
FIG. 21 is a plan view for describing an arrangement example of a precision flotation unit, a quasi-precision flotation unit, and a rough flotation unit.

In the laser irradiation apparatus 1_5 illustrated in FIG. 21, the length of the laser irradiation position 15 in the y-axis direction is approximately one half the length of the workpiece 16 in the y-axis direction. The laser irradiation position 15 is located toward an edge portion of the stage, and a half of the region on the workpiece 16 in the y-axis direction is irradiated with the laser beam while the workpiece 16 passes through the laser irradiation position 15. In the laser irradiation apparatus 1_5 illustrated in FIG. 21, the workpiece 16 is conveyed over the stage in the direction of the arrows, and the workpiece 16 is irradiated with the laser beam in multiple batches. Thus, the entire surface of the workpiece 16 can be processed. The precision flotation unit 11 is disposed so as to include the laser irradiation position 15. The length of the precision flotation unit 11 in the y-axis direction is approximately the same as the length of the laser irradiation position 15 in the y-axis direction. The quasi-precision flotation unit 12 is disposed on each side of the precision flotation unit 11 in the x-axis direction. The rough flotation unit 13 is disposed on a site other than where the precision flotation unit 11 and the quasi-precision flotation unit 12 are disposed. In the laser irradiation apparatus 1_5 illustrated in FIG. 21, the workpiece 16 may be conveyed over the stage so that the workpiece 16 passes through the laser irradiation position 15 a plurality of times. In other words, the workpiece 16 may be conveyed over the stage so that a given portion of the workpiece 16 is irradiated with the laser beam a plurality of times.

In the arrangement examples illustrated in FIGS. 17 to 21, the precision flotation unit 11 and the quasi-precision flotation unit 12, which are relatively expensive, are disposed only in the vicinity of the irradiation position 15 of the laser beam, and the rough flotation unit 13, which can be constituted inexpensively, is disposed in the remaining region. In other words, a large portion of the flotation unit is constituted by the rough flotation unit 13, which is inexpensive, and thus the cost of the laser irradiation apparatus can be reduced. In addition, the region that requires precise control can be limited to the region where the precision flotation unit 11 and the quasi-precision flotation unit 12 are disposed, and thus the control of the laser irradiation apparatus can be simplified.

(Another Configuration Example of Quasi-Precision Flotation Unit)

Figure 22:
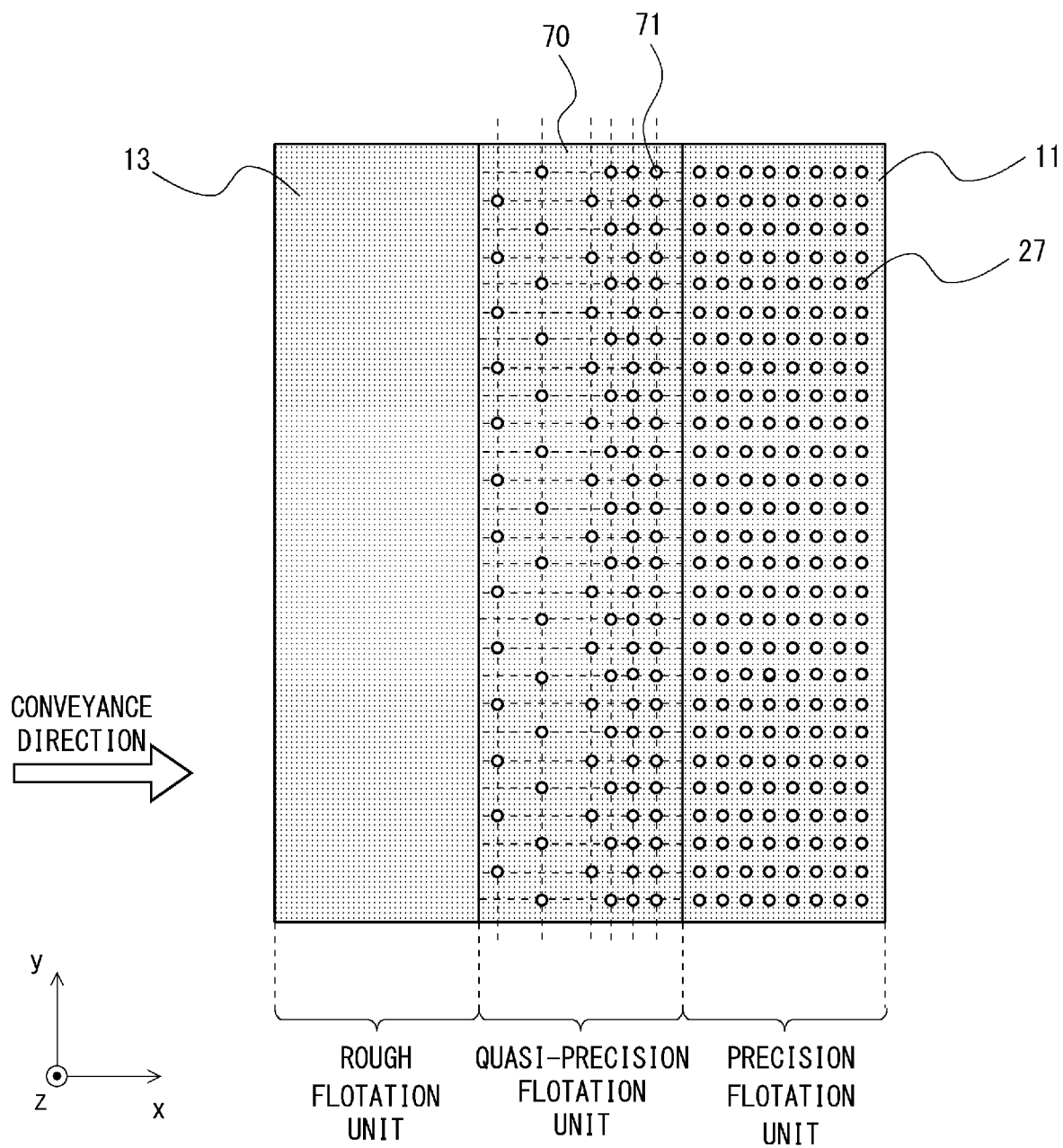
FIG. 22 is a plan view for describing another configuration example of a quasi-precision flotation unit.

Next, another configuration example of the quasi-precision flotation unit will be described. FIG. 22 is a plan view for describing another configuration example of the quasi-precision flotation unit. In the configuration example illustrated in FIG. 22, the rough flotation unit 13, a quasi-precision flotation unit 70, and the precision flotation unit 11 are arrayed in the conveyance direction. A porous member is provided on the upper surfaces of the rough flotation unit 13, the quasi-precision flotation unit 70, and the precision flotation unit 11, that is, on their surfaces that are to oppose the workpiece 16. In the rough flotation unit 13, the quasi-precision flotation unit 70, and the precision flotation unit 11 illustrated in FIG. 22 as well, a compressed gas is ejected upward from the upper surface of the porous member. Thus, the workpiece 16 floats.

The quasi-precision unit 70 and the precision flotation unit 11 include a plurality of intake pores 71 and 27, respectively, for sucking in a gas present between the workpiece 16 and the quasi-precision flotation unit 70 and between the workpiece 16 and the precision flotation unit 11. In the quasi-precision unit 70 illustrated in FIG. 22, the plurality of intake pores 71 are disposed more densely in a portion toward the precision flotation unit 11 than in a portion toward the rough flotation unit 13. In the precision flotation unit 11, the intake pores 27 are disposed densely, similarly to the intake pores 71 in the portion of the quasi-precision flotation unit 70 toward the precision flotation unit 11.

In this manner, as illustrated in FIG. 22, disposing the intake pores 71 in the quasi-precision flotation unit 70 so that the density of the intake pores 71 increases gradually from the portion toward the rough flotation unit 13 to the portion toward the precision flotation unit 11 allows the deflection amount of the workpiece 16 to change more smoothly while the workpiece 16 is being conveyed from the rough flotation unit 13 to the precision flotation unit 11.

(Other Configuration Examples of Precision Flotation Unit)

Figure 23:
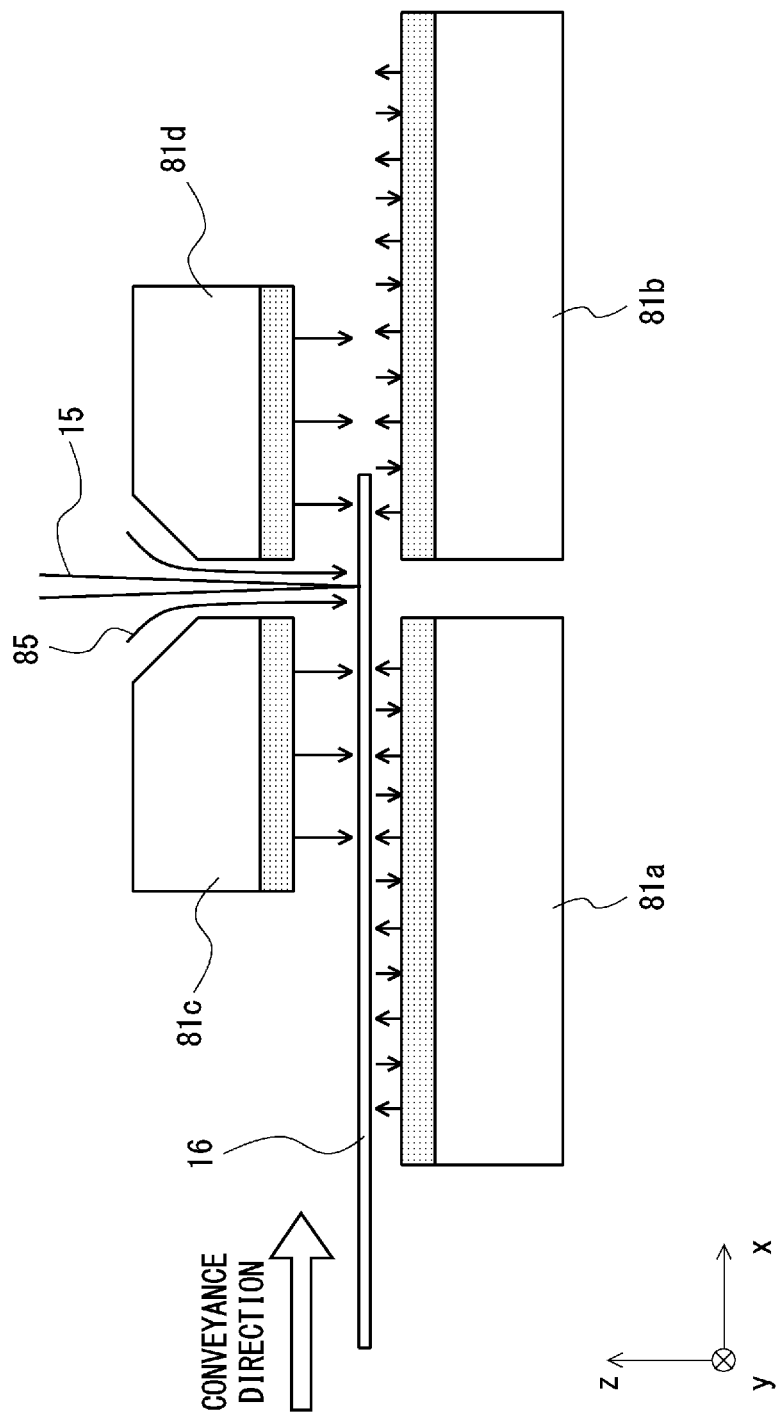
FIG. 23 is a sectional view for describing another configuration example of a precision flotation unit.

FIG. 23 is a sectional view for describing another configuration example of the precision flotation unit. The precision flotation unit illustrated in FIG. 23 is constituted by lower units 81a and 81b and upper units 81c and 81d. The lower units 81a and 81b and the upper units 81c and 81d are also referred to collectively as precision flotation units 81a to 81d.

The lower units 81a and 81b, which correspond to the precision flotation units 11a and 11b described above, cause the workpiece 16 to float by ejecting a gas upward from a porous member disposed on the upper surfaces of the lower units 81a and 81b. In addition, the lower units 81a and 81b reduce deflection of the workpiece 16 by sucking in a gas present between the workpiece 16 and the lower units 81a and 81b through a plurality of intake pores formed in the upper surfaces of the lower units 81a and 81b.

The upper units 81c and 81d are disposed above the respective lower units 81a and 81b. To rephrase, the upper units 81c and 81d are disposed at positions where the upper units 81c and 81d oppose the respective lower units 81a and 81b with the workpiece 16 interposed therebetween. The upper units 81c and 81d blow a gas against the upper surface of the workpiece 16 while the workpiece 16 is being conveyed. This can further reduce deflection of the workpiece 16. A space is formed between the upper unit 81c and the upper unit 81d, and a sealing gas 85 is fed through this space onto the surface of the workpiece 16. The sealing gas 85 is an inert gas, such as nitrogen, and the gas blown from the upper units 81c and 81d is also an inert gas, such as nitrogen. Thus, the surface of the workpiece 16 corresponding to the irradiation position of the laser beam 15 can be locally sealed with an inert gas, such as nitrogen gas.

Providing a laser displacement sensor above the upper units 81c and 81d and allowing a measuring laser from the laser displacement sensor to pass through the space between the upper unit 81c and the upper unit 81d makes it possible to measure the displacement (deflection amount) of the workpiece 16 in the z-axis direction at the irradiation position of the laser beam 15 in real time. The measured value of this laser displacement sensor may be used to perform feedback control on the gas ejection amount or the suction amount of the precision flotation units 81a to 81d and the quasi-precision flotation unit 12.

Figure 24:
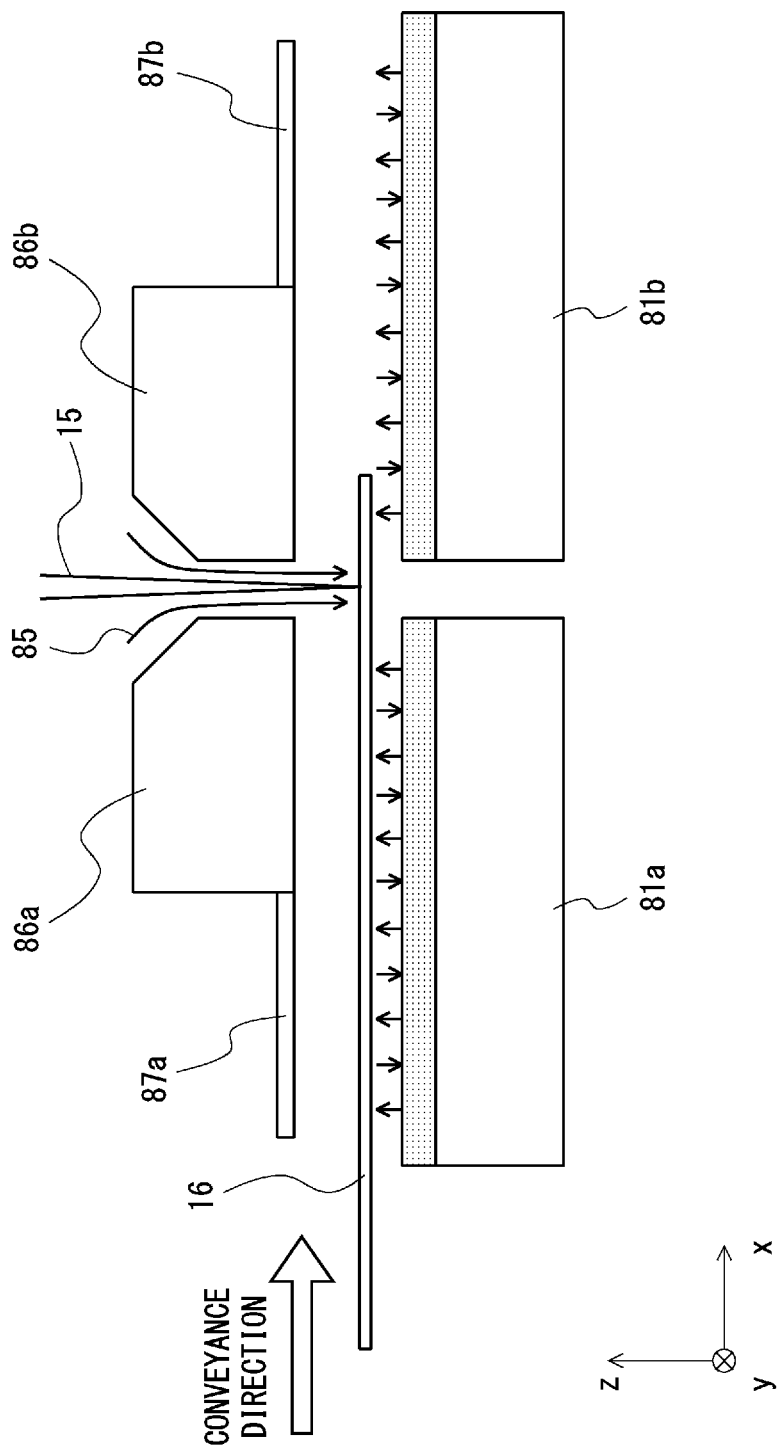
FIG. 24 is a sectional view for describing yet another configuration example of a precision flotation unit.

In the present embodiment, upper units 86a and 86b illustrated in FIG. 24 may be provided, in place of the upper units 81c and 81d illustrated in FIG. 23. The upper units 86a and 86b illustrated in FIG. 24 are disposed above the respective lower units 81a and 81b. To rephrase, the upper units 86a and 86b are disposed at positions where the upper units 86a and 86b oppose the respective lower units 81a and 81b with the workpiece 16 interposed therebetween. The upper units 86a and 86b illustrated in FIG. 24 do not blow any gas against the upper surface of the workpiece 16 while the workpiece 16 is being conveyed. The precision flotation unit illustrated in FIG. 24 conveys the workpiece 16 with the use of the lower units 81a and 81b.

A space is formed between the upper unit 86a and the upper unit 86b, and the sealing gas 85 is fed through this space onto the surface of the workpiece 16. The sealing gas 85 is an inert gas, such as nitrogen. Thus, the surface of the workpiece 16 corresponding to the irradiation position of the laser beam 15 can be locally sealed with an inert gas, such as nitrogen gas. In the precision flotation unit illustrated in FIG. 24, a plate-shaped member 87a is provided upstream from the upper unit 86a, and a plate-shaped member 87b is provided downstream from the upper unit 86b. In this manner, providing the plate-shaped members 87a and 87b, in addition to the upper units 86a and 86b, above the lower units 81a and 81b makes it possible to increase the sealing effect of the sealing gas 85. For example, the upper units 86a and 86b and the plate-shaped members 87a and 87b can be formed of an aluminum plate.

(Another Configuration Example of Each Flotation Unit)

Figure 25:
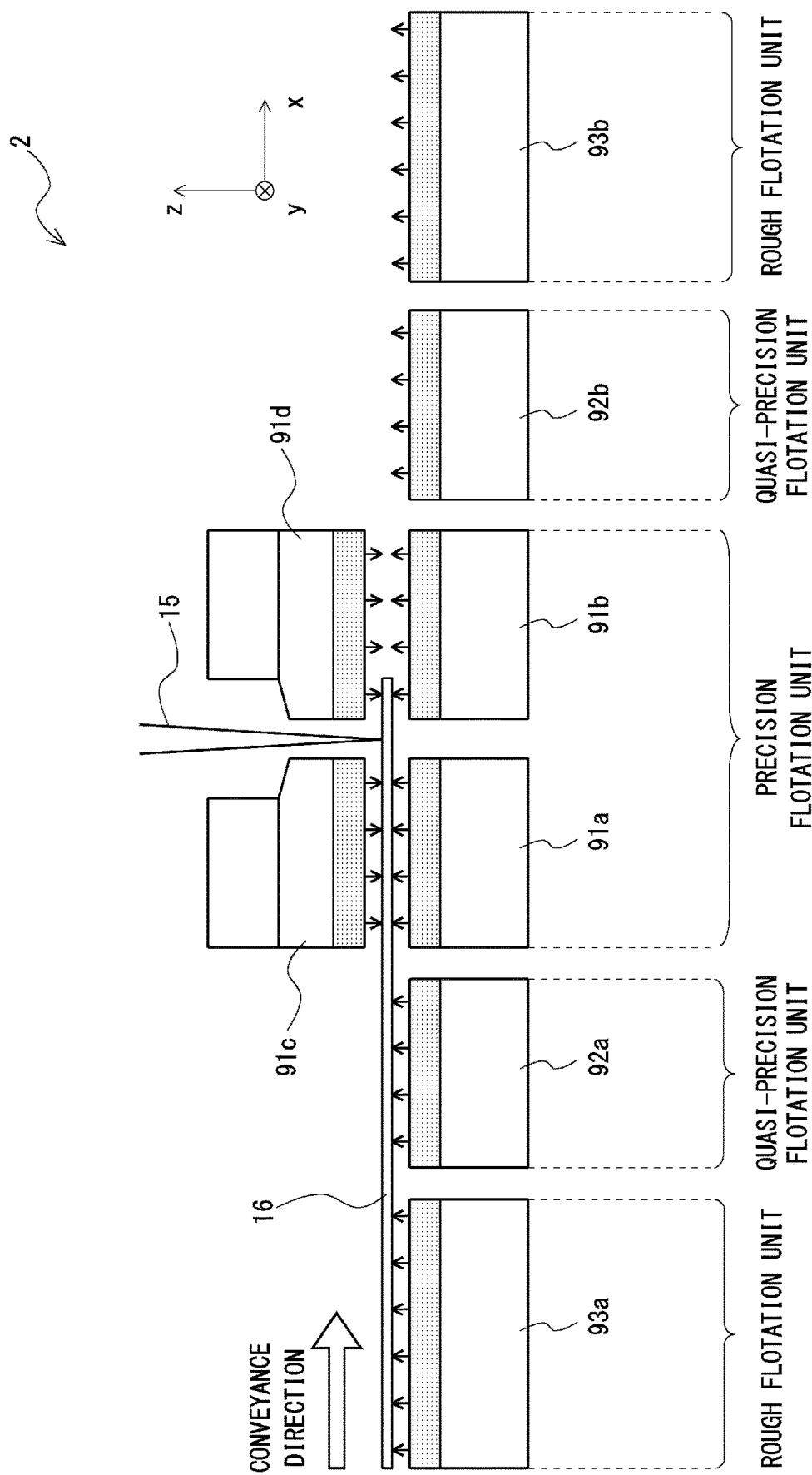
FIG. 25 is a sectional view for describing another configuration example of flotation units included in a laser irradiation apparatus.

FIG. 25 is a sectional view for describing another configuration example of each flotation unit included in a laser irradiation apparatus 2. In the laser irradiation apparatus 2 illustrated in FIG. 25, a precision flotation unit is constituted by lower units 91a and 91b and upper units 91c and 91d. The lower units 91a and 91b and the upper units 91c and 91d are also referred to collectively as precision flotation units 91a to 91d.

The lower units 91a and 91b cause the workpiece 16 to float by ejecting a gas upward from a porous member disposed on the upper surfaces of the lower units 91a and 91b. In the laser irradiation apparatus illustrated in FIG. 25, the lower units 91a and 91b are not provided with any intake pore (see FIG. 9) for sucking in a gas present between the workpiece 16 and the lower units 91a and 91b.

The upper units 91c and 91d are disposed above the respective lower units 91a and 91b. To rephrase, the upper units 91c and 91d are disposed at positions where the upper units 91c and 91d oppose the respective lower units 91a and 91b with the workpiece 16 interposed therebetween. The upper units 91c and 91d blow a gas against the upper surface of the workpiece 16 while the workpiece 16 is being conveyed. In this manner, sandwiching the workpiece 16 with the lower units 91a and 91b and the upper units 91c and 91d and blowing a gas against the workpiece 16 from the above and the below makes it possible to reduce deflection of the workpiece 16 while the workpiece 16 is being conveyed.

The gas blown from the upper units 91c and 91d is an inert gas, such as nitrogen. Thus, the surface of the workpiece 16 corresponding to the irradiation position of the laser beam 15 can be locally sealed with an inert gas, such as nitrogen gas. In the laser irradiation apparatus 2 illustrated in FIG. 25 as well, a space is formed between the upper unit 91c and the upper unit 91d. Thus, a sealing gas (inert gas, such as nitrogen) may be fed through this space onto the surface of the workpiece 16.

Quasi-precision flotation units 92a and 92b cause the workpiece 16 to float by ejecting a gas from upper portions of the quasi-precision flotation units 92a and 92b. In the laser irradiation apparatus 2 illustrated in FIG. 25, the quasi-precision flotation units 92a and 92b are not provided with any intake pore (see FIG. 9) for sucking in a gas present between the workpiece 16 and the quasi-precision flotation units 92a and 92b.

Rough flotation units 93a and 93b cause the workpiece 16 to float by ejecting a gas from upper portions of the rough flotation units 93a and 93b. The rough flotation units 93a and 93b have a configuration similar to the configuration of those in the laser irradiation apparatus 1 illustrated in FIGS. 5 and 5.

In the laser irradiation apparatus 2 illustrated in FIG. 25, a configuration in which the flotation units are disposed with a space provided therebetween is illustrated. Alternatively, no space may be provided between the flotation units.

In the laser irradiation apparatus 2 illustrated in FIG. 25, the flotation units 91a, 91b, 92a, 92b, 93a, and 93b disposed under the workpiece 16 are each constituted by a unit that ejects a gas only in an upward direction. In addition, the upper units 91c and 91d are provided in the precision float region and are configured to blow a gas against the upper surface of the workpiece 16 while the workpiece 16 is being conveyed. The quasi-precision flotation units 92a and 92b are configured to be capable of having their gas ejection amounts controlled with a higher precision than the rough flotation units 93a and 93b.

Accordingly, the quasi-precision flotation unit 92a can convey the workpiece 16 so that the deflection amount of the workpiece 16 changes smoothly while the workpiece 16 is conveyed from the rough flotation unit 93a to the precision flotation units 91a to 91d. In addition, the quasi-precision flotation unit 92b can convey the workpiece 16 so that the deflection amount of the workpiece 16 changes smoothly while the workpiece 16 is conveyed from the precision flotation units 91a to 91d to the rough flotation unit 93b.

In the laser irradiation apparatus 2 illustrated in FIG. 25 as well, providing a laser displacement sensor above the upper units 91c and 91d and allowing a measuring laser from the laser displacement sensor to pass through the space between the upper unit 91c and the upper unit 91d makes it possible to measure the displacement (deflection amount) of the workpiece 16 in the z-axis direction at the irradiation position of the laser beam 15 in real time. The measured value of this laser displacement sensor may be used to perform feedback control on the gas ejection amount of the precision flotation units 91a to 91d and the quasi-precision flotation units 92a and 92b.

(Method of Manufacturing Semiconductor Device)

Next, a method of manufacturing a semiconductor device with the use of the laser irradiation apparatus described above will be described. In the present embodiment, a laser annealing apparatus is used as the laser irradiation apparatus, and thus an amorphous film formed on a substrate can be irradiated with a laser beam to crystallize the amorphous film. For example, the semiconductor device is provided with a TFT (Thin Film transistor). In this case, an amorphous silicon film is irradiated with a laser beam and crystallized, and a polysilicon film can thus be formed.

Figure 26:
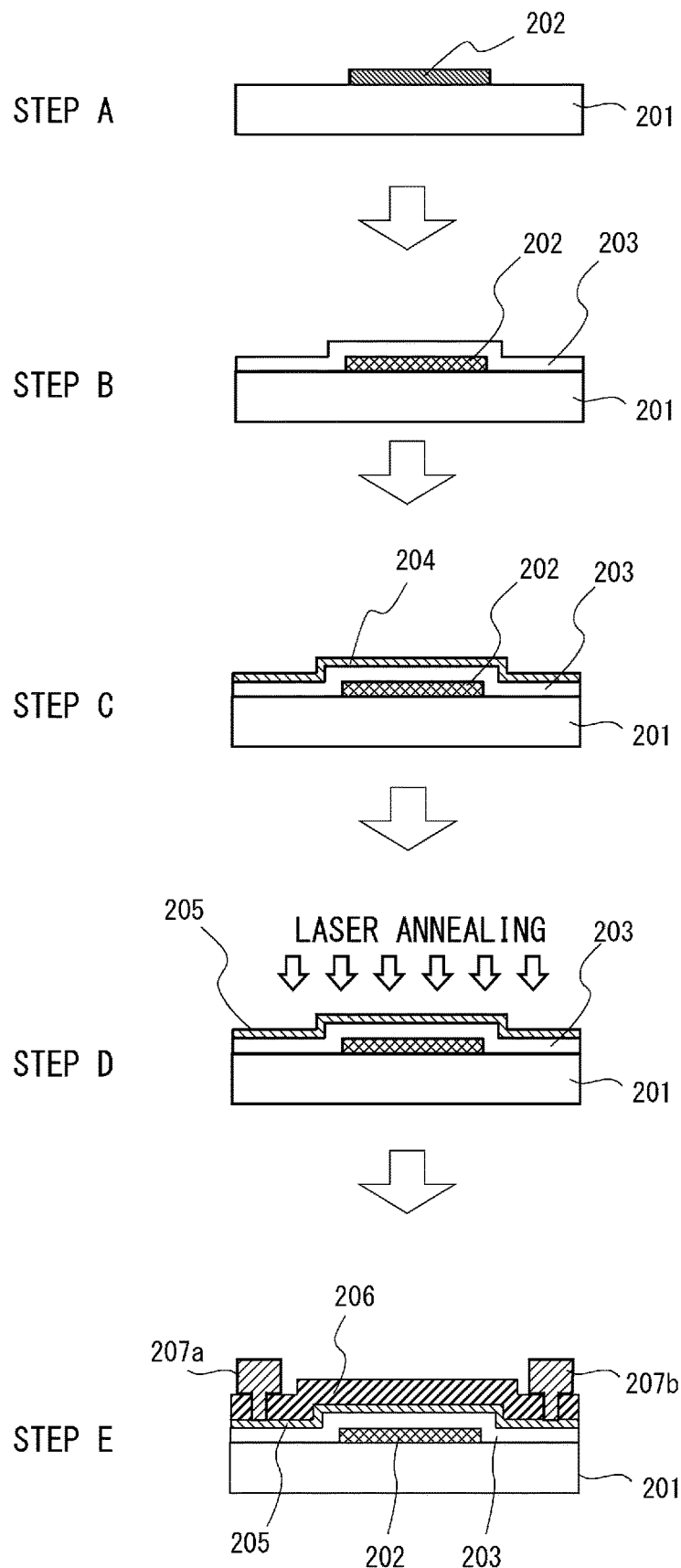
FIG. 26 is a sectional view for describing a method of manufacturing a semiconductor device.

FIG. 26 is a sectional view for describing an example of a method of manufacturing a semiconductor device. The laser irradiation apparatus according to the present embodiment described above is suitable for manufacturing a TFT array substrate. Hereinafter, a method of manufacturing a semiconductor device having a TFT will be described.

First, as illustrated in step A in FIG. 26, a gate electrode 202 is formed on a glass substrate 201. A metal thin film including aluminum or the like can be used for the gate electrode 202, for example. Then, as illustrated in step B in FIG. 26, a gate insulating film 203 is formed on the gate electrode 202. The gate insulating film 203 is formed so as to cover the gate electrode 202. Thereafter, as illustrated in step C in FIG. 26, an amorphous silicon film 204 is formed on the gate insulating film 203. The amorphous silicon film 204 is disposed so as to overlap the gate electrode 202 with the gate insulating film 203 interposed therebetween.

The gate insulating film 203 is a silicon nitride film ($SiN_x$), a silicon oxide film ($SiO_2$ film), a layered film of these, or the like. Specifically, the gate insulating film 203 and the amorphous silicon film 204 are deposited consecutively through a CVD (Chemical Vapor Deposition) technique.

Then, as illustrated in step D in FIG. 26, the amorphous silicon film 204 is irradiated with a laser beam with the use of the laser irradiation apparatus described above to crystallize the amorphous silicon film 204, and a polysilicon film 205 is thus formed. With this process, the polysilicon film 205 in which silicon is crystallized is formed on the gate insulating film 203.

At this point, using the laser irradiation apparatus according to the present embodiment described above makes it possible to reduce deflection of the substrate 201 (workpiece) while the substrate 201 is being conveyed, and the amorphous silicon film 204 can be kept from being out of the depth of focus (DOF) of the irradiating laser beam. Accordingly, the polysilicon film 205 that is uniformly crystallized can be formed.

Thereafter, as illustrated in step E in FIG. 26, an interlayer insulating film 206, a source electrode 207a, and a drain electrode 207b are formed on the polysilicon film 205. The interlayer insulating film 206, the source electrode 207a, and the drain electrode 207b can be formed with a typical photolithography technique or film forming technique.

With the use of the method of manufacturing a semiconductor device described above, a semiconductor device provided with a TFT can be manufactured. Manufacturing processes thereafter differ for different devices to be manufactured in the end, and thus descriptions thereof will be omitted.

(Organic EL Display)

Figure 27:
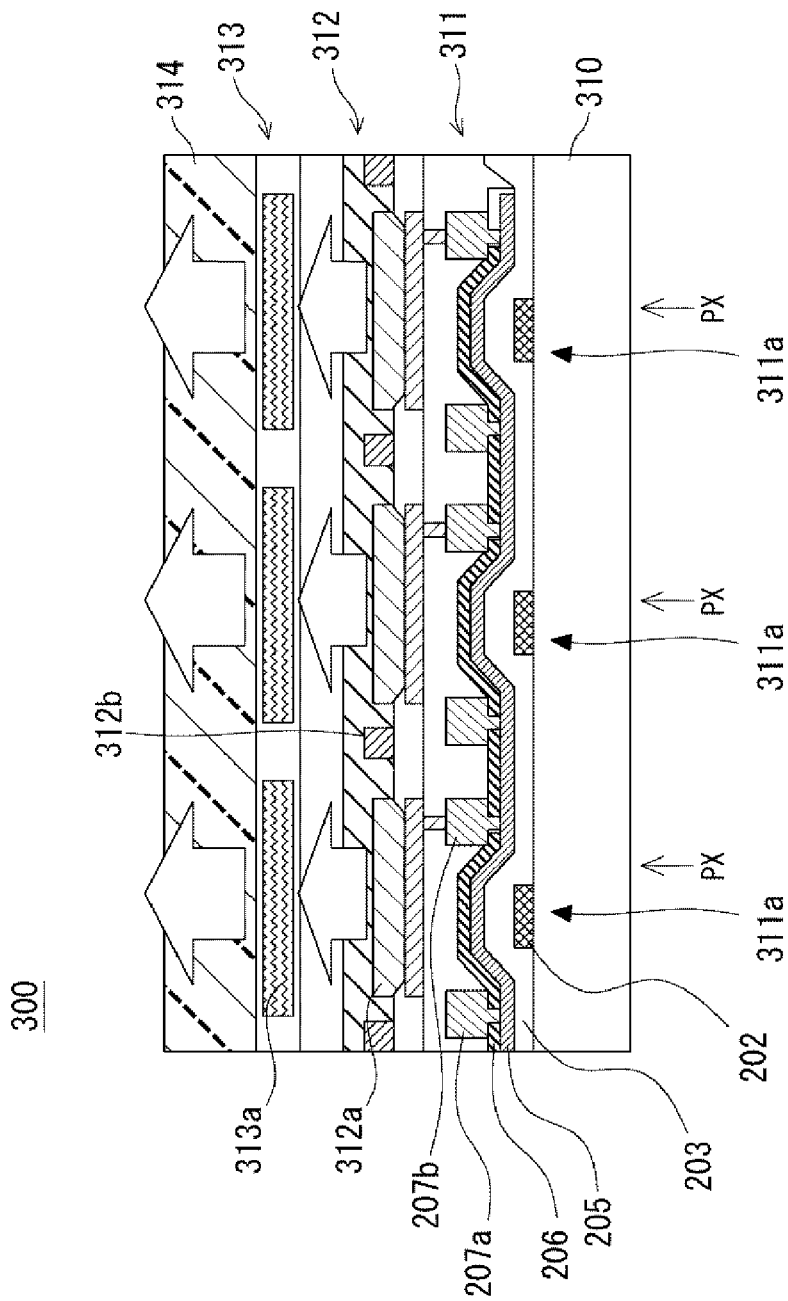
FIG. 27 is a sectional view for describing an overview of an organic EL display.

Next, an organic EL display will be described as an example of a device in which a semiconductor device provided with a TFT is used. FIG. 27 is a sectional view for describing an overview of the organic EL display, and a pixel circuit of the organic EL display is illustrated in a simplified manner. An organic EL display 300 illustrated in FIG. 27 is an active-matrix display apparatus in which a TFT is disposed in each pixel PX.

The organic EL display 300 includes a substrate 310, a TFT layer 311, an organic layer 312, a color filter layer 313, and a sealing substrate 314. FIG. 27 illustrates an organic EL display of a top-emission system in which the sealing substrate 314 is located on a viewing side. The following description illustrates one configuration example of the organic EL display, and the present embodiment is not limited to the configuration described below. For example, the semiconductor device according to the present embodiment may be used in an organic EL display of a bottom-emission system.

The substrate 310 is a glass substrate or a metal substrate. The TFT layer 311 is provided on the substrate 310. The TFT layer 311 includes a TFT 311a disposed in each pixel PX. The TFT layer 311 further includes a wire and so on to be coupled to the TFT 311a. The TFT 311a, the wire, and so on constitute a pixel circuit. The TFT layer 311 corresponds to the TFT illustrated in FIG. 26 and includes a gate electrode 202, a gate insulating film 203, a polysilicon film 205, an interlayer insulating film 206, a source electrode 207a, and a drain electrode 207b.

The organic layer 312 is provided on the TFT layer 311. The organic layer 312 includes an organic EL light-emitting element 312a disposed in each pixel PX. The organic EL light-emitting element 312a has a layered structure in which, for example, an anode, a hole injection layer, a hole transport layer, a light-emitting layer, an electron transport layer, an electron injection layer, and a cathode are stacked together.

In the case of the top-emission system, the anode is a metal electrode, and the cathode is a transparent conductive film of ITO (Indium Tin Oxide) or the like. The organic layer 312 is further provided with a partition wall 312b for separating each organic EL light-emitting element 312a between the pixels PX.

The color filter layer 313 is provided on the organic layer 312. The color filter layer 313 is provided with a color filter 313a for providing color display. Specifically, a resin layer colored in R (red), G (green), or B (blue) is provided in each pixel PX as a color filter 313a. White light emitted from the organic layer 312 is converted into RGB color light upon passing through the color filter 313a. In a case of a three-color system in which organic EL light-emitting elements that emit light in RGB colors are provided in the organic layer 312, the color filter layer 313 may be omitted.

The sealing substrate 314 is provided on the color filter layer 313. The sealing substrate 314 is a transparent substrate, such as a glass substrate, and is provided so as to prevent degradation of the organic EL light-emitting elements in the organic layer 312.

A current that flows in the organic EL light-emitting elements 312a of the organic layer 312 varies with a display signal supplied to the pixel circuits. Therefore, the emission amount of each pixel PX can be controlled by supplying a display signal corresponding to a display image to each pixel PX. Thus, a desired image can be displayed.

In the foregoing, the organic EL display has been described as an example of the device in which a semiconductor device provided with a TFT is used. Alternatively, the semiconductor device provided with a TFT may be a liquid-crystal display, for example. In the case described above, the laser irradiation apparatus according to the present embodiment is applied to a laser annealing apparatus. Alternatively, the laser irradiation apparatus according to the present embodiment can also be applied to an apparatus other than a laser annealing apparatus.

Thus far, the invention made by the present inventors has been described in concrete terms on the basis of the embodiments, but the present invention is not limited to the foregoing embodiments, and it is needless to say that various modifications are possible within the scope that does not depart from the spirit of the present invention.

This application claims priority to Japanese Patent Application No. 2016-166465, filed on Aug. 29, 2016, and the entire disclosure of which is incorporated herein.

REFERENCE SIGNS LIST 1, 2 laser irradiation apparatus
10 flotation unit
11, 11a, 11b precision flotation unit
12, 12a to 12d quasi-precision flotation unit
13, 13a to 13f rough flotation unit
15 laser beam, laser irradiation position
16 workpiece
18 holder
21 pedestal
22 porous member
24_1, 24_2 feeding port
25_1, 25_2 discharging port
26 flow channel
27 intake pore
31 pedestal
32 porous member
34_1, 34_2 feeding port

The invention claimed is:

1. A laser irradiation apparatus, comprising:
    a laser generating device configured to generate a laser beam; and
    a flotation unit configured to cause a workpiece to float, the workpiece being to be irradiated with the laser beam, wherein
    the flotation unit includes a first region and a second region,
    the first region and the second region are disposed so that, as viewed in a plan view, a focal point of the laser beam is superposed on the first region and the focal point of the laser beam is not superposed on the second region,
    the first region is configured to cause the workpiece to float by utilizing ejection and suction of a gas, and
    the second region is configured to cause the workpiece to float by utilizing ejection of a gas without suction of a gas,
    a flatness of a surface of the first region that opposes the workpiece is smaller than a flatness of a surface of the second region that opposes the workpiece.

2. The laser irradiation apparatus according to claim 1, wherein
    the flotation unit further includes a third region disposed between the first region and the second region,
    the third region is configured to cause the workpiece to float by utilizing ejection and suction of a gas, and
    the first region and the third region are configured to allow the gas in the first region and the gas in the third region to be controlled independently from each other in the first region and the third region.

3. The laser irradiation apparatus according to claim 2, wherein the first region includes
    a first gas ejecting unit configured to cause the workpiece to float by ejecting a gas upward; and
    a plurality of first intake pores configured to suck in a gas present between the workpiece and the first region.

4. The laser irradiation apparatus according to claim 3, wherein
    the first gas ejecting unit is constituted by a porous member, and
    the plurality of first intake pores are disposed evenly in a surface of the porous member that opposes the workpiece.

5. The laser irradiation apparatus according to claim 3, wherein the third region includes
    a second gas ejecting unit configured to cause the workpiece to float by ejecting a gas upward; and
    a plurality of second intake pores configured to suck in a gas present between the workpiece and the third region.

6. The laser irradiation apparatus according to claim 5, wherein
    the second gas ejecting unit is constituted by a porous member, and
    the plurality of second intake pores are disposed in a surface of the porous member that opposes the workpiece, the plurality of second intake pores being disposed more densely on the first region side than on the second region side.

7. The laser irradiation apparatus according to claim 5, wherein the second region includes a third gas ejecting unit configured to cause the workpiece to float by ejecting a gas upward.

8. The laser irradiation apparatus according to claim 5, wherein
    an amount of a gas fed to the first gas ejecting unit and an amount of a gas fed to the second gas ejecting unit can be controlled independently from each other, and
    an amount of a gas sucked in through the first intake pores and an amount of a gas sucked in through the second intake pores can be controlled independently from each other.

9. The laser irradiation apparatus according to claim 1, wherein disposed in the first region are
    a lower unit disposed below a conveyance path of the workpiece, the lower unit including a gas ejecting unit and a plurality of intake pores, the gas ejecting unit being configured to cause the workpiece to float by ejecting a gas upward, the plurality of intake pores being configured to suck in a gas present between the workpiece and the lower unit; and
    an upper unit disposed above the conveyance path of the workpiece, the upper unit being configured to blow a gas against an upper surface of the workpiece.

10. The laser irradiation apparatus according to claim 9, wherein
    a space is formed in the upper unit, the space allowing the laser beam to pass therethrough, and
    a sealing gas is fed through the space onto an irradiation region of the laser beam on the workpiece.

11. A laser irradiation apparatus, comprising:
    a laser generating device configured to generate a laser beam; and
    a flotation unit configured to cause a workpiece to float, the workpiece being to be irradiated with the laser beam, wherein
    the flotation unit includes a first region and a second region,
    the first region and the second region are disposed so that, as viewed in a plan view, a focal point of the laser beam is superposed on the first region and the focal point of the laser beam is not superposed on the second region,
    the first region is configured to cause the workpiece to float by utilizing ejection and suction of a gas, and
    the second region is configured to cause the workpiece to float by utilizing ejection of a gas, and
    a flatness of a surface of the first region that opposes the workpiece is smaller than a flatness of a surface of the second region that opposes the workpiece.

12. The laser irradiation apparatus according to claim 11, wherein
    the flotation unit further includes a third region disposed between the first region and the second region,
    the third region is configured to cause the workpiece to float by utilizing ejection and suction of a gas, and
    a flatness of a surface of the third region that opposes the workpiece is larger than the flatness of the surface of the first region that opposes the workpiece and is smaller than the flatness of the surface of the second region that opposes the workpiece.

13. A laser irradiation apparatus, comprising:
    a laser generating device configured to generate a laser beam; and
    a flotation unit configured to cause a workpiece to float, the workpiece being to be irradiated with the laser beam, wherein
    the flotation unit includes a first region and a second region,
    the first region and the second region are disposed so that, as viewed in a plan view, a focal point of the laser beam is superposed on the first region and the focal point of the laser beam is not superposed on the second region, the first region is configured to cause the workpiece to float by utilizing ejection and suction of a gas, and the second region is configured to cause the workpiece to float by utilizing ejection of a gas, a flatness of a surface of the first region that opposes the workpiece is smaller than a flatness of a surface of the second region that opposes the workpiece, and a deflection amount of the workpiece held when the workpiece passes through the first region is smaller than the deflection amount of the workpiece held when the workpiece passes through the second region.

14. The laser irradiation apparatus according to claim 13, wherein the flotation unit further includes a third region disposed between the first region and the second region, the third region is configured to cause the workpiece to float by utilizing ejection and suction of a gas, and the flotation unit in the third region conveys the workpiece so that the deflection amount of the workpiece changes smoothly while the workpiece is conveyed from the second region to the first region.

15. A laser irradiation method of irradiating a workpiece with a laser beam while the workpiece is being made to float with the use of a flotation unit, wherein the flotation unit includes a first region and a second region, the first region being superposed on a focal point of the laser beam as viewed in a plan view, the second region not being superposed on the focal point of the laser beam as viewed in a plan view, a flatness of a surface of the first region that opposes the workpiece is smaller than a flatness of a surface of the second region that opposes the workpiece, and when the workpiece is conveyed with the use of the flotation unit, the first region conveys the workpiece while causing the workpiece to float by utilizing ejection and suction of a gas, and the second region conveys the workpiece while causing the workpiece to float by utilizing ejection of a gas without suction of a gas.

16. A method of manufacturing a semiconductor device, the method comprising steps of:

(a) forming an amorphous film over a substrate; and (b) irradiating the amorphous film with a laser beam to crystalize the amorphous film, wherein the step of (b) is a step of irradiating the amorphous film with the laser beam while conveying the substrate caused to float with the use of a flotation unit, the flotation unit includes a first region and a second region, the first region being superposed on a focal point of the laser beam as viewed in a plan view, the second region not being superposed on the focal point of the laser beam as viewed in a plan view, a flatness of a surface of the first region that opposes the substrate is smaller than a flatness of a surface of the second region that opposes the substrate, and when the substrate is conveyed with the use of the flotation unit, the first region conveys the substrate while causing the substrate to float by utilizing ejection and suction of a gas, and the second region conveys the substrate while causing the substrate to float by utilizing ejection of a gas without suction of a gas.

17. A laser irradiation method of irradiating a workpiece with a laser beam while the workpiece is being made to float with the use of a flotation unit, wherein the flotation unit includes a first region and a second region, the first region being superposed on a focal point of the laser beam as viewed in a plan view, the second region not being superposed on the focal point of the laser beam as viewed in a plan view, a flatness of a surface of the first region that opposes the workpiece is smaller than a flatness of a surface of the second region that opposes the workpiece, when the workpiece is conveyed with the use of the flotation unit, the first region conveys the workpiece while causing the workpiece to float by utilizing ejection and suction of a gas, and the second region conveys the workpiece while causing the workpiece to float by utilizing ejection of a gas, and a deflection amount of the workpiece held when the workpiece passes through the first region is smaller than the deflection amount of the workpiece held when the workpiece passes through the second region.

18. A method of manufacturing a semiconductor device, the method comprising steps of:

(a) forming an amorphous film over a substrate; and (b) irradiating the amorphous film with a laser beam to crystalize the amorphous film, wherein the step of (b) is a step of irradiating the amorphous film with the laser beam while conveying the substrate caused to float with the use of a flotation unit, the flotation unit includes a first region and a second region, the first region being superposed on a focal point of the laser beam as viewed in a plan view, the second region not being superposed on the focal point of the laser beam as viewed in a plan view, a flatness of a surface of the first region that opposes the substrate is smaller than a flatness of a surface of the second region that opposes the substrate, when the substrate is conveyed with the use of the flotation unit, the first region conveys the substrate while causing the substrate to float by utilizing ejection and suction of a gas, the second region conveys the workpiece while causing the workpiece to float by utilizing ejection of a gas, and a deflection amount of the workpiece held when the workpiece passes through the first region is smaller than the deflection amount of the workpiece held when the workpiece passes through the second region.

19. The laser irradiation apparatus according to claim 2, wherein disposed in the first region are a lower unit disposed below a conveyance path of the workpiece, the lower unit including a gas ejecting unit and a plurality of intake pores, the gas ejecting unit being configured to cause the workpiece to float by ejecting a gas upward, the plurality of intake pores being configured to suck in a gas present between the workpiece and the lower unit; and an upper unit disposed above the conveyance path of the workpiece, the upper unit being configured to blow a gas against an upper surface of the workpiece.

20. The laser irradiation apparatus according to claim 19, wherein
a space is formed in the upper unit, the space allowing the laser beam to pass therethrough, and
a sealing gas is fed through the space onto an irradiation region of the laser beam on the workpiece.

* * * * *